(12) United States Patent
Kurosaki et al.

(10) Patent No.: US 6,906,355 B2
(45) Date of Patent: Jun. 14, 2005

(54) SEMICONDUCTOR DEVICE

(75) Inventors: Toru Kurosaki, Saitama (JP); Hiroaki Shishido, Saitama (JP); Mizue Kitada, Saitama (JP); Shinji Kunori, Saitama (JP); Kosuke Ohshima, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/677,429

(22) Filed: Oct. 3, 2003

(65) Prior Publication Data
US 2004/0070002 A1 Apr. 15, 2004

(30) Foreign Application Priority Data
Oct. 4, 2002 (JP) ........................................ 2002-291841

(51) Int. Cl.⁷ .............................................. H01L 29/74
(52) U.S. Cl. ........................ 257/127; 257/396; 257/397; 257/409; 257/452; 257/484; 257/490; 257/495
(58) Field of Search ................................ 257/127, 170, 257/339, 372–376, 394–400, 409, 452, 484, 490, 493–495, 605

(56) References Cited

U.S. PATENT DOCUMENTS

| | | | | |
|---|---|---|---|---|
| 3,898,684 A | * | 8/1975 | Davidsohn | 257/400 |
| 5,670,821 A | * | 9/1997 | Bowers | 257/547 |
| 6,768,138 B1 | | 7/2004 | Kitada et al. | 257/127 |
| 2003/0160262 A1 | | 8/2003 | Kitada et al. | 257/127 |

* cited by examiner

*Primary Examiner*—David Nelms
*Assistant Examiner*—Andy Huynh
(74) *Attorney, Agent, or Firm*—Armstrong, Kratz, Quintos, Hanson & Brooks, LLP.

(57) ABSTRACT

A semiconductor device having guard grooves uniformly filled with a semiconductor filler is provided. The four corners of a rectangular ring-shaped guard groove meet at right angles, and outer and inner auxiliary diffusion regions both rounded are connected to the four corners. Since the guard grooves do not have to be rounded, the plane orientation of a silicon single crystal exposed inside the guard grooves can be all {100}. Therefore, epitaxial growth in the guard grooves is uniformly carried out, and the grooves are filled with guard regions without defects.

22 Claims, 20 Drawing Sheets

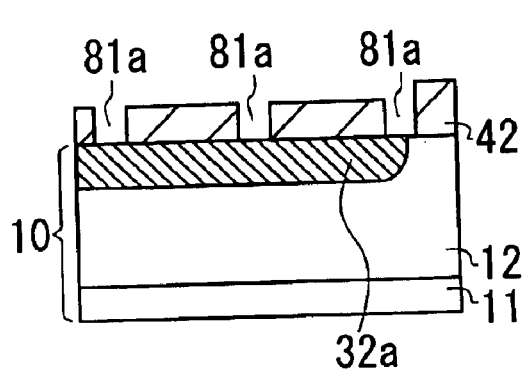
Fig. 6a  Fig. 6b
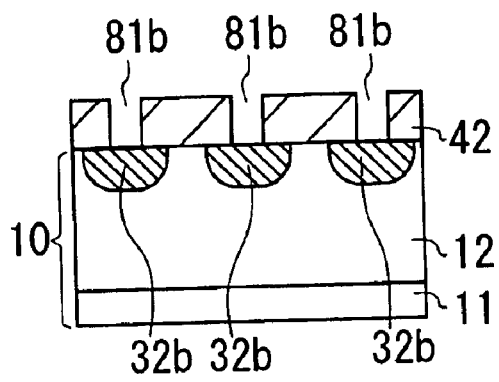
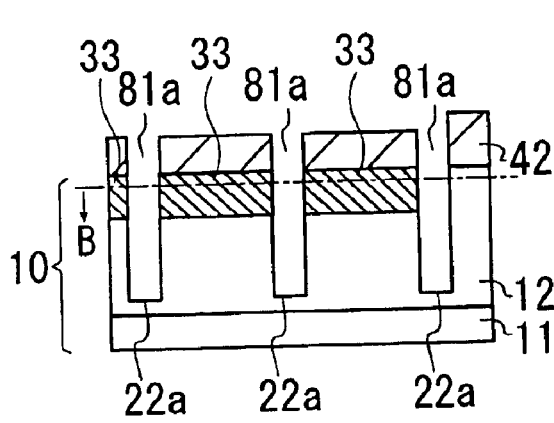
Fig. 7a  Fig. 7b
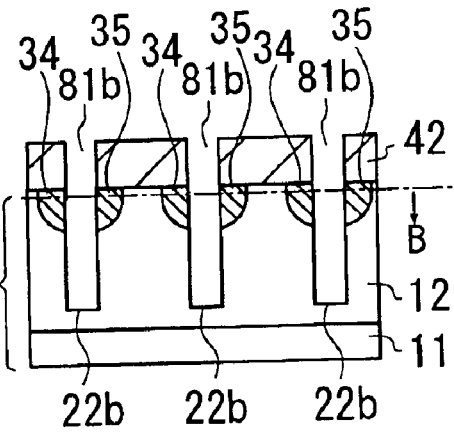
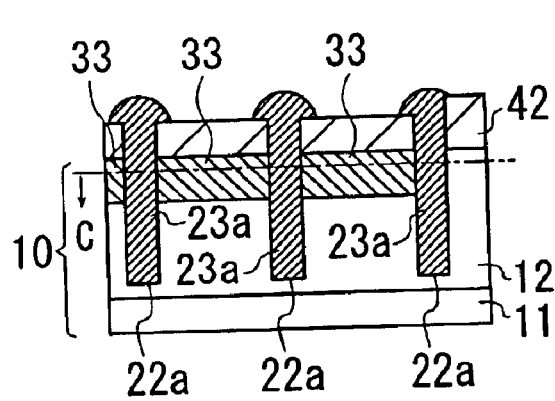
Fig. 8a  Fig. 8b
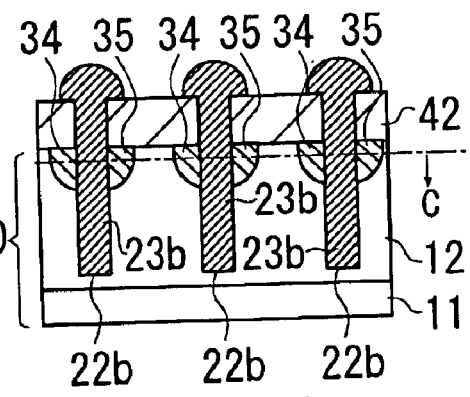

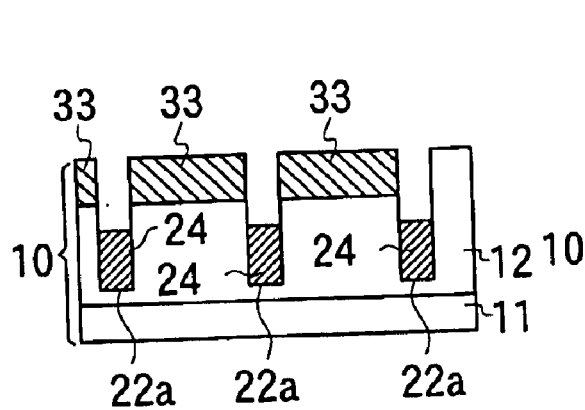
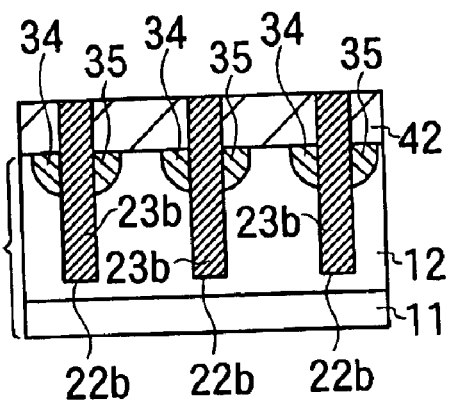
Fig. 13a  Fig. 13b
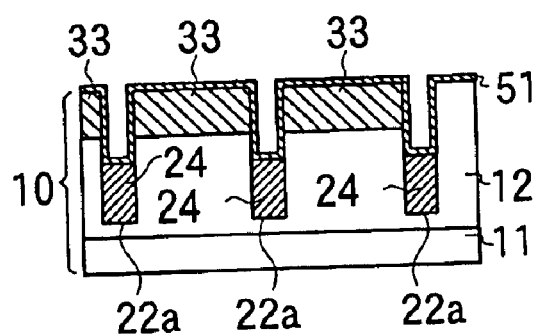
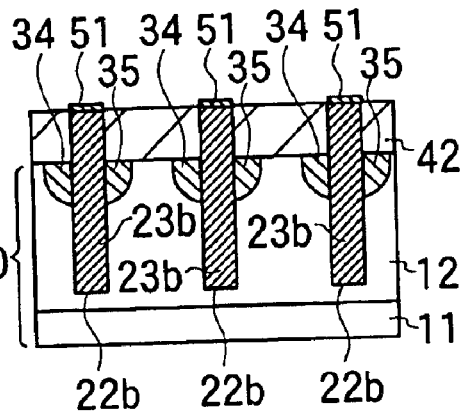
Fig. 14a  Fig. 14b
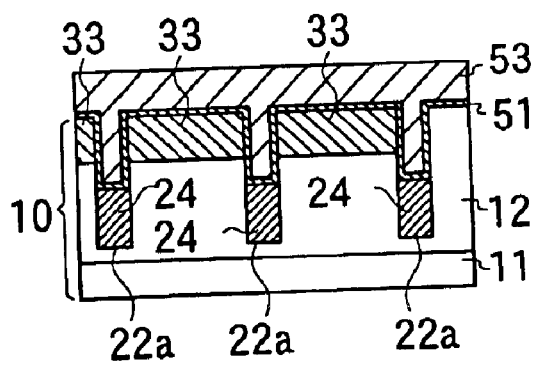
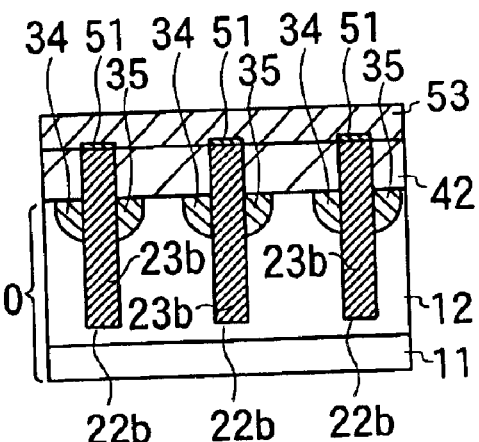
Fig. 15a  Fig. 15b

SEMICONDUCTOR DEVICE

BACKGROUND OF THE INVENTION

1. Field of the Invention

The present invention relates to semiconductor devices, and more particularly, to a semiconductor device having grooves filled with a semiconductor filler.

2. Description of the Related Art

FIG. 36(a) is a plan view for use in illustration of the diffusion structure of a conventional MOSFET 101, and FIG. 36(b) is an enlarged view of the part encircled by the chain-dotted line in the FIG. 36(a). The gate insulating film 151 is omitted from FIG. 36(a) and the gate insulating film 51 as described below is also omitted from FIG. 1 and FIG. 31.

The MOSFET 101 has a growth layer 112 of an n-type epitaxial layer, and about in the center of the rectangular region of the growth layer 112 for the single MOSFET 101, there is a p-type base region 133 formed by impurity diffusion.

A plurality of elongated active grooves 122a are provided in parallel to one another across the base region 133. An n-type source region 139 is formed by impurity diffusion in the base region 133 and on one or both sides of each active groove 122a. Two source regions 139 oppose each other between the active grooves 122a, and a $p^+$-type ohmic region 138 is formed by impurity diffusion between these two source regions 139.

A plurality of rectangular ring-shaped, guard grooves 122b with a narrow width are provided concentrically around the active grooves 122a and the base region 133. In other words, the active grooves 122a and the base region 133 are concentrically surrounded by these guard grooves 122b.

FIGS. 37(a) and 37(b) are sectional views taken along the lines I—I and II—II, respectively in FIG. 36(a).

At the inner circumferential surface and the bottom of the active groove 122a, a gate insulating film 151 is formed. The region surrounded by the gate insulating film 151 is filled with a gate electrode 158 made of a polysilicon material.

Here, the gate insulating film 151 is not formed at the inner circumference of the guard groove 122b, a p-type silicon single crystal is epitaxially grown from the bottom and side face of the guard groove 122b, and the guard grooves 122b are filled with a guard region 123 made of the silicon single crystal.

An oxide film 157 is provided on the gate electrodes 158 and the guard regions 123. The oxide film 157 is patterned to have an opening each on the source region 139 and the ohmic region 138. The surfaces of the source regions 139 and the ohmic regions 138 are exposed at the bottom surfaces of the openings.

A source electrode 161 made of a thin metal film is formed on the surfaces of the exposed regions and the surface of the oxide film 157.

The growth layer 112 is provided on one surface of a substrate 111 of an $n^+$-type silicon single crystal, and a drain electrode 171 of a thin metal film is formed on the other surface of the substrate 111.

The base region 133 is in contact with the gate insulating film 151 in a position lower than the source region 139. When the contacted portion is made to serve as an inversion region, the source electrode 161 is connected to a ground potential and positive voltage is applied to the drain electrode 171, the application of positive voltage not less than the threshold voltage to the gate electrode 158 inverts the inversion region of the base region 133 to be n-type conductivity. The inversion layer connects the source region 139 and the growth layer 112 to allow current to flow.

In this state, when the voltage of the gate electrode 158 is less than threshold voltage, the inversion layer disappears and the current does not flow. For example, the voltage can be less than threshold voltage to connect the gate electrode 158 to the source electrode 161.

In this state, the pn junction between the base region 133 and the growth layer 112 is reverse-biased, and a depletion layer expands both inside the base region 133 and the growth layer 112.

These ring-shaped semiconductor regions that have the same conductivity as that of the base region and concentrically surround the base region are generally called "guard rings" and the guard region 123 serves as a guard ring in the MOSFET 101. Once the depletion layer transversely expanding in the growth layer 112 reaches the guard region 123, the depletion layer expands outwardly from the guard region 123. The depletion layer sequentially reaches the concentric guard regions 123 and expands, and therefore the depletion layer is more expanded than the case without the guard regions 123. The electric field intensity in the growth layer 112 is reduced accordingly.

Herein, if {100} includes all the following plane orientations:

(100), (010), (001), ($\bar{1}$00), (0$\bar{1}$0), (00$\bar{1}$)

the surface plane orientation of the substrate 111 is {100}, and the plane orientation of the surface of the growth layer 112 grown on the surface of the substrate 111 or the bottom surface of the guard grooves 122b is also {100}.

The substrate 111 has, for example, a mark (orientation flat) that indicates the {100} direction of the surface of the substrate 111.

In order to form a patterned resist film for the guard grooves 122b so that the guard grooves 122b are formed by etching, the pattern extending direction of the guard grooves 122b and the mark of the substrate 111 are aligned, and in this way, the pattern for the guard grooves 122b extends in the {100} direction.

The side faces of the guard grooves 122b are formed perpendicularly to the surface of the substrate 111, and the side faces are parallel to each other or orthogonal to each other. Therefore, a {100} plane is exposed at the inner circumferential side face of the guard grooves 122b that are actually formed by etching.

At the bottom face, a {100}-orientated plane the same as the surface of growth layer 112 is exposed, and therefore the {100} plane is exposed at the bottom and all the side faces inside the guard grooves 122b.

Consequently, the silicon single crystal forming the guard regions 123 uniformly grows to fully fill the guard grooves 122b.

In this case, when the four sides of the guard grooves 122b are connected at right angles, a part curved at right angles forms at the surface of the pn junction formed between the guard region 123 and the growth layer 112, which lowers the withstanding voltage.

Therefore, according to the conventional techniques, in order to prevent the withstanding voltage from being lowered, the four corners of the guard groove 122b are curved at a predetermined radius of curvature, so that the surface part of the pn junction formed at the interface between the guard region 123 and the growth layer 112 is not curved at right angles.

However, when the guard grooves 122b are rounded at the four corners like this, as shown in FIG. 36(b), the side face $S_1$ in the part of the guard groove 122b extending linearly in the direction horizontally in the figure and the side face $S_2$ extending linearly in the direction from the top to the bottom of the figure are in the {100} orientation but the round part connecting side faces $S_1$ and $S_2$ is not in the {100} plane orientation. For example, the intermediate side face $S_3$ is in the {110} plane orientation.

The growth rate of the silicon single crystal to form the guard region 123 is different between the linear part and the curved part at the four corners of the guard grooves 122b. This prevents the guard grooves 122b from being uniformly filled inside. Voids left in the unevenly filled guard regions 123 can lower the withstanding voltage in the position, which makes the device defective as a whole.

SUMMARY OF THE INVENTION

The present invention is directed to a solution to the above-described disadvantages associated with the conventional techniques, and it is an object of the invention to provide a semiconductor device having uniformly filled guard grooves.

In order to achieve the above described object, according to the invention is a semiconductor device includes a growth layer of a first conductivity type, a rectangular ring-shaped guard groove surrounding a part having at least one region of a second conductivity type formed in the growth layer, and a guard region of the second conductivity type provided in the guard groove. An outer circumferential portion of four corners of the guard region is connected to an outer circumferential auxiliary diffusion region of the second conductivity type for adding round region to the four corners.

According to the invention, a semiconductor device includes a growth layer of a first conductivity type, a rectangular ring-shaped guard groove surrounding a part having at least one region of a second conductivity type formed in the growth layer, and a guard region of the second conductivity type provided in the guard groove. An outer circumference of the guard region is connected to a ring-shaped outer circumferential auxiliary diffusion region of the second conductivity type surrounding the guard region, and having its four corners rounded at an outer circumferential portion thereof.

According to the invention, the semiconductor device inculudes a plurality of the guard grooves are concentrically provided, and each of the guard grooves is connected with the outer circumferential auxiliary diffusion region.

According to the invention, a semiconductor device includes a growth layer of a first conductivity type, a rectangular ring-shaped guard groove concentrically surrounding a part having at least one region of a second conductivity type formed in the growth layer, a guard region of the second conductivity type provided in the guard groove. The device further includes a ring-shaped outer circumferential auxiliary diffusion region of the second conductivity type in contact with an outer circumference of the guard region and having its four corners at an outer circumferential portion thereof rounded, and a ring-shaped inner circumferential auxiliary diffusion region of the second conductivity type in contact with an inner circumference of the guard region.

According to the invention, the semiconductor device includes that the inner circumferential auxiliary diffusion region has its four corners rounded at an inner circumferential portion thereof.

According to the invention, in the semiconductor device, a plurality of the guard grooves are concentrically provided, and each of the guard grooves is connected with the outer and inner circumferential auxiliary diffusion regions.

According to the invention, in the semiconductor device, a {100} plane is exposed at four side faces and bottom face of the guard groove, and the guard region is made of a semiconductor single crystal epitaxially grown at the side faces and the bottom face of the guard groove.

According to the invention, in the semiconductor device includes that the outer circumferential auxiliary diffusion region is formed by diffusing an impurity of the second conductivity type from the surface of the growth layer.

According to the invention of the semiconductor device, the outer circumferential auxiliary diffusion region is formed in a level shallower than the depth of the guard region.

According to the invention of the semiconductor device, a cell for a MOS transistor is formed in the part surrounded by the guard grooves. The MOS transistor has a base region of the second conductivity type, a source region of the first conductivity type formed in the base region, a gate insulating film in contact with the base region, and a gate electrode in contact with the gate insulating film.

According to the invention of the semiconductor device, in the part surrounded by the guard grooves, a Schottky electrode to form a Schottky junction with the growth layer is provided.

According to the invention as described above, the guard grooves are formed in the growth layer. The planar shape of the guard groove is a rectangular ring shape, and the side faces in the guard grooves are approximately orthogonal to each other.

The guard region is made of four plate pieces of a filler, and the depth of the guard groove is set as one side in the longitudinal direction, the length of one side of the guard groove is set as one side in the transverse direction, and the width of the guard groove is set as thickness. At the four corners of the guard region at the surface, the sides form the ring in approximately right angle to each other.

At the four-corner part, an outer circumferential auxiliary diffusion region is connected to the outer circumferential side and an inner circumferential auxiliary diffusion region is connected with the inner circumferential side. The outer and inner circumferential auxiliary diffusion regions have a rounded part, and the four corners of the guard region are rounded with the rounded part.

Consequently, the {100} plane can be exposed at the inner wall surface and bottom face of the guard grooves, and therefore the guard grooves can be filled without voids.

BRIEF DESCRIPTION OF THE DRAWINGS

FIG. 6(a) is a fourth sectional view for illustrating the step of manufacturing the part corresponding to the section taken along the line X—X in FIG. 1;

FIG. 6(b) is a fourth sectional view for illustrating of the step of manufacturing the part corresponding to the section taken along the line Y—Y in FIG. 1;

FIG. 7(a) is a fifth sectional view for illustrating the step of manufacturing the part corresponding to the section taken along the line X—X in FIG. 1;

FIG. 7(b) is a fifth sectional view for illustrating the step of manufacturing the part corresponding to the section taken along the line Y—Y in FIG. 1

FIG. 8(a) is a sixth sectional view for illustrating the step of manufacturing the part corresponding to the section taken along the line X—X in FIG. 1;

FIG. 8(b) is a sixth sectional view for illustrating the step of manufacturing the part corresponding to the section taken along the line Y—Y in FIG. 1;

FIG. 13(a) is an 11th sectional view for illustrating the step of manufacturing the part corresponding to the section taken along the line X—X in FIG. 1;

FIG. 13(b) is an 11th sectional view for illustrating the step of manufacturing the part corresponding to the section taken along the line Y—Y in FIG. 1;

FIG. 14(a) is a 12th sectional view for illustrating the step of manufacturing the part corresponding to the section taken along the line X—X in FIG. 1;

FIG. 14(b) is a 12th sectional view for illustrating the step of manufacturing the part corresponding to the section taken along the line Y—Y in FIG. 1;

FIG. 15(a) is a 13th sectional view for illustrating the step of manufacturing the part corresponding to the section taken along the line X—X in FIG. 1;

FIG. 15(b) is a 13th sectional view for illustrating the step of manufacturing the part corresponding to the section taken along the line Y—Y in FIG. 1;

DETAILED DESCRIPTION OF THE PREFERRED EMBODIMENTS

Now, an embodiment of the invention will be described in conjunction with the accompanying drawings.

In this embodiment and the other embodiments that will described below, when the first conductivity type is n type, the second conductivity type is p type, and vice versa. The present invention includes to both cases.

Figure 1:
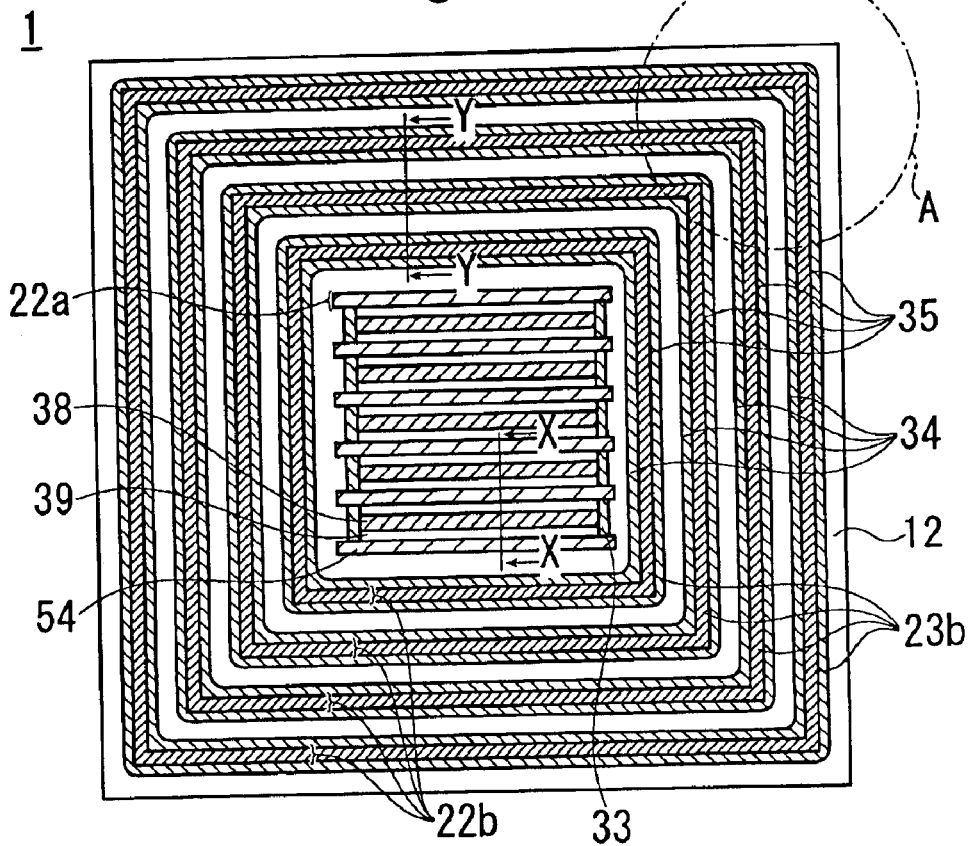
FIG. 1 is a plan view showing the MOSFET diffusion structure of a semiconductor device according to one embodiment of the present invention.

FIG. 1 is a plan view illustrating the diffusion structure of a semiconductor device represented by the reference numeral 1 according to one embodiment of the present invention.

The semiconductor device 1 includes a substrate 11 made of a silicon single crystal of a first conductivity type, and a growth layer 12 of a silicon epitaxial layer of the first conductivity type. The growth layer is epitaxially grown on the surface of the substrate 11.

In a position within the growth layer 12 near the surface, an impurity of a second conductivity type is diffused from the surface of the growth layer 12, and thus a base region 33 of the second conductivity type is formed.

A plurality of elongated active grooves 22a are provided at regular intervals and parallel to each other across the base region 33. An ohmic region 38 having the same conductivity type as that of the base region 33 and a higher concentration than that of the base region 33 is provided about in the center between the active grooves 22a and in the base region 33 near the surface.

A source region 39 of the first conductivity type formed by diffusion of a first conductivity type impurity is provided on one or both sides of each of the active grooves 22a. Therefore, the ohmic region 38 is positioned between the source regions 39 of the opposite conductivity type.

On the surface in the growth layer 12, a plurality of rectangular ring-shaped guard grooves 22b are concentrically formed in a location to surround the active grooves 22a and the base region 33.

In the guard grooves 22b, guard regions 23b of a semiconductor single crystal (silicon single crystal in this case) of the opposite conductivity type to that of the growth layer 12 is formed by epitaxial growth. All the guard grooves 22b are filled inside with the guard regions 23b.

The guard region 23b forms a pn junction with the growth layer 12, and the base region 33 and the active grooves 22a are surrounded concentrically by the pn junctions. The guard regions 23b are not in contact with the base region 33 and are held at a floating potential.

An outer circumferential auxiliary diffusion region 35 and an inner circumferential auxiliary diffusion region 34 both of the same conductivity type as that of the guard region 23b are provided all around the inner and outer circumferences of the guard grooves 22b. Therefore, the outer and inner circumferential auxiliary diffusion regions 35 and 34 both have a ring shape. The outer and inner circumferential auxiliary diffusion regions 35 and 34 are in contact with the guard region 23b and at the same potential as that of the guard region 23b.

The plane orientations of the surfaces of the substrate 11 of the silicon single crystal and the surface of the growth layer 12 are {100}, and the {100} plane is exposed at the bottom face of each guard groove 22b. The four corners of the guard grooves 22b meet at right angles, and the {100} plane is exposed both at the side face in the vertical and horizontal directions of the four sides of the guard grooves 22b.

Consequently, the guard regions 23b epitaxially grow uniformly without defects at the four corners, and the guard grooves 22b are filled inside with no void.

The four corners of the outer circumferential auxiliary diffusion region 35 and the four corners of the inner circumferential auxiliary diffusion region 34 are curved with a prescribed curvature so that the inner and outer circumferences of the four corners of the guard region 23b are added round region. For the round region of four corners of the outer circumferential auxiliary diffusion region 35 and round region of four corners of the inner circumferential auxiliary diffusion region 34, the four corners of the outer circumferential auxiliary diffusion region 35 and the four corners of the inner circumferential auxiliary diffusion region 34 are formed so as to be quarter of circle-shaped, for example. The radius of the circle is 0.7 $\mu$m or more.

Figure 2:
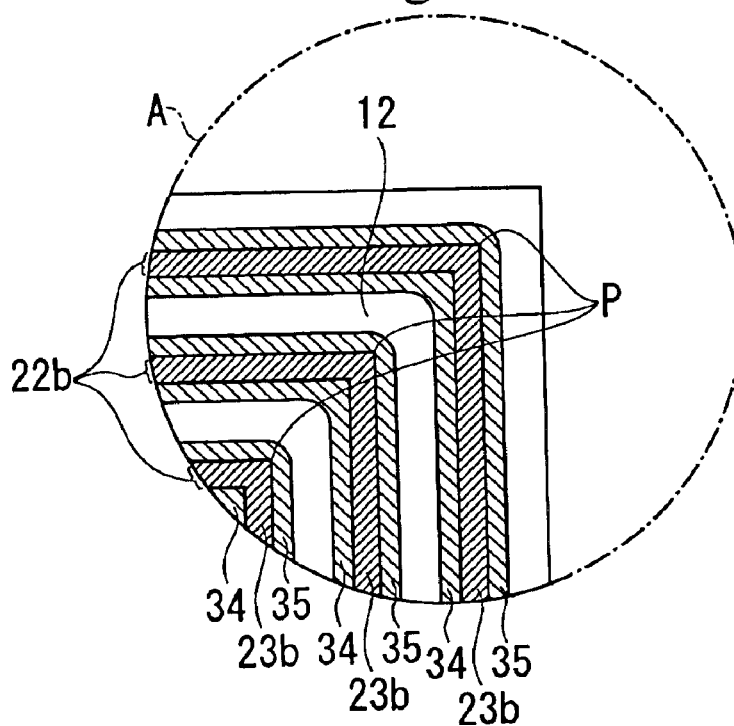
FIG. 2 is an enlarged view of the corner portion.

FIG. 2 is an enlarged view of the corner portion A in the semiconductor device 1. The apexes P at the outer corners of the guard regions 23b are connected with rounded parts of the outer circumferential auxiliary diffusion regions 35, so that no pn junction is formed between the growth layer 12 and the guard region 23b from the surface of the guard regions 23b to the depth of the outer circumferential auxiliary diffusion regions 35 at the apexes P at the corners.

The semiconductor device 1 is a discrete type MOS transistor having a plurality of MOS transistor cells formed in a region surrounded by the innermost one of the inner circumferential auxiliary diffusion regions 34.

The process of forming the inner and outer circumferential auxiliary diffusion regions 34 and 35 described above and the process of forming MOSFET cells will be described in conjunction with FIGS. 3(a) to 25(b).

FIGS. 3(a), 4(a), 5(a) to 25(a) are sectional views taken along the line X—X in FIG. 1, and FIGS. 3(b), 4(b), 5(b) to 25(b) are sectional views taken along the line Y—Y in FIG. 1.

In general, the process of patterning a thin film such as an oxide film includes a photolithography step of forming a patterned resist film on a thin film, and a step of etching the thin film using the resist film as a mask. These photolithography and etching steps are left out of the following description. The oxide film formed on the back surface of the substrate 11 is not described either.

Figure 3A:
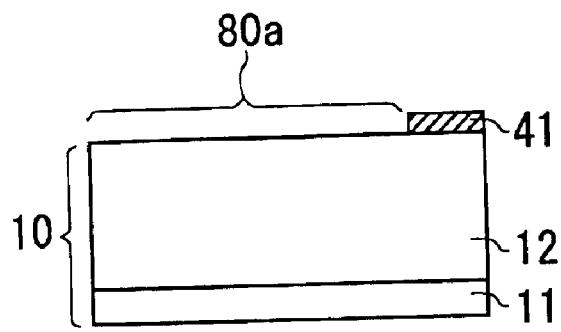
FIG. 3(a) is a first sectional view for illustrating the step of manufacturing the part corresponding to a section taken along the line X—X in FIG. 1.
Figure 3B:
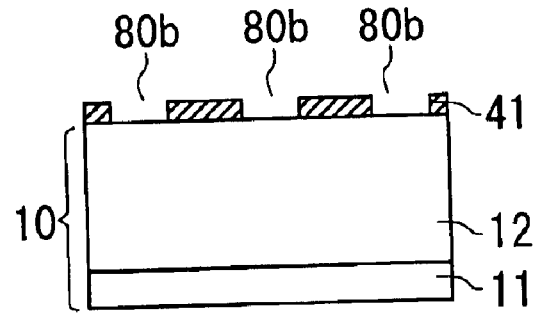
FIG. 3(b) is a first sectional view for illustrating the step of manufacturing the part corresponding to a section taken along the line Y—Y in FIG. 1.

With reference to FIGS. 3(a) and 3(b), as described above, the reference numeral 11 represents a substrate of a silicon single crystal of the first conductivity type, the growth layer 12 of the first conductivity type is epitaxially grown on the surface of the substrate 11, and thus a substrate 10 to be processed is prepared.

Thermal oxidation is carried out to form an oxide film on the surface of the growth layer 12, and then patterning is carried out to form a rectangular window opening 80a, and rectangular ring-shaped, ring window openings 80b concentrically surrounding the rectangular window opening 80a when viewed from above are formed.

Figure 26:
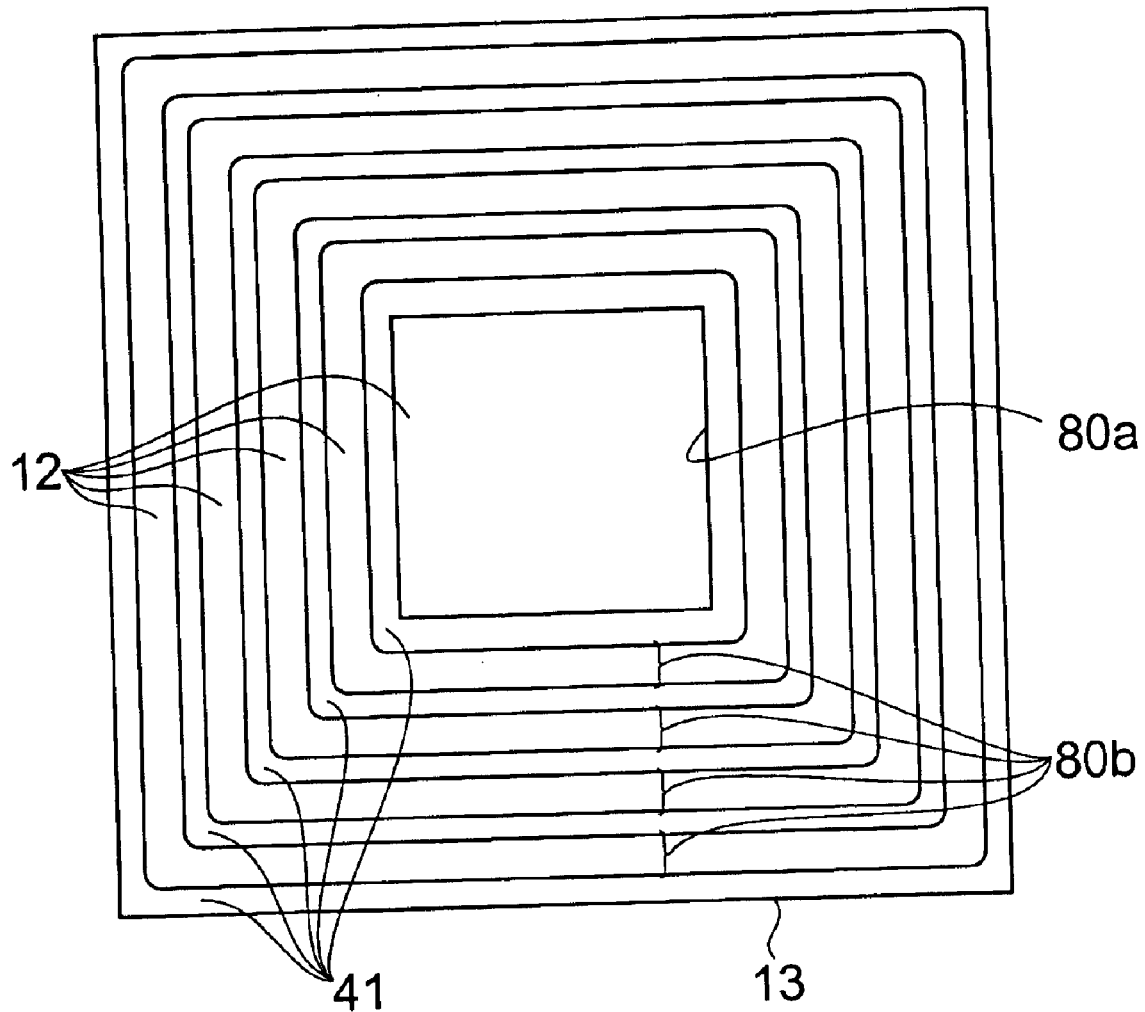
FIG. 26 is a plan view of the state in which a growth layer is exposed at the bottom of a window portion.

The reference numeral 41 represents the patterned oxide film, and as shown in the plan view in FIG. 26, the four corners at the inner and outer circumferential sides of the ring window openings 80b are rounded. The growth layer 12 has a surface exposed at the bottoms of all the window openings 80a and 80b.

The reference numeral 13 in FIG. 26 represents the boundary between the patterns for a plurality of semiconductor devices 1 obtained at the end of the steps that will be described. The boundaries 13 between the semiconductor devices 1 are a prescribed distance apart from each other, and the oxide film 41 between the boundaries 13 is removed. The part between the boundaries 13 is cut and the plurality of semiconductor devices 1 formed in a single substrate 10 to be processed are separated from each other. The rectangular window opening 80a is provided about in the center of the region within the boundary 13.

After the rectangular window opening 80a and the ring window openings 80b are formed, a thin oxide film is formed on the exposed surface of the growth layer 12 as required. Then, using the oxide film 41 as a mask, an impurity of the second conductivity type such as boron is implanted.

Figure 4A:
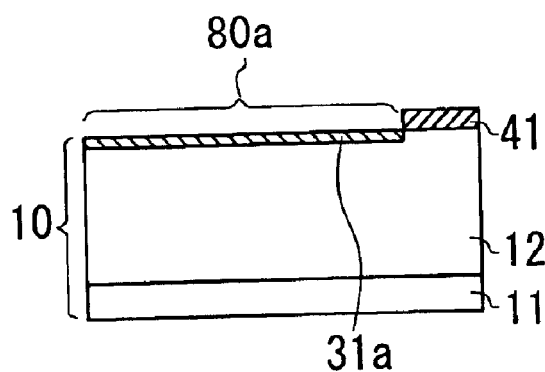
FIG. 4(a) is a second sectional view for illustrating the step of manufacturing the part corresponding to the section taken along the line X—X in FIG. 1.
Figure 4B:
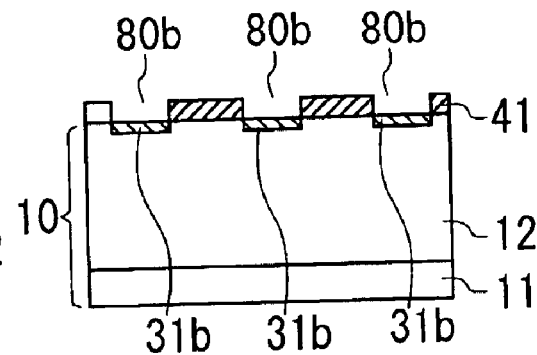
FIG. 4(b) is a second sectional view for illustrating the step of manufacturing the part corresponding to the section taken along the line Y—Y in FIG. 1.

The reference characters 31a and 31b in FIGS. 4(a) and 4(b) represent high concentration impurity regions formed in a considerably shallow region in the growth layer 12 by implanting the impurity of the second conductivity type.

Then, thermal treatment is carried out so that the impurity of the second conductivity type contained in the high concentration impurity regions 31a and 31b is diffused. Then, as shown in FIGS. 5(a) and 5(b), a rectangular diffusion region 32a is formed under the rectangular window opening 80a, and ring-shaped diffusion regions 32b are formed under the ring window openings 80b.

Figure 5A:
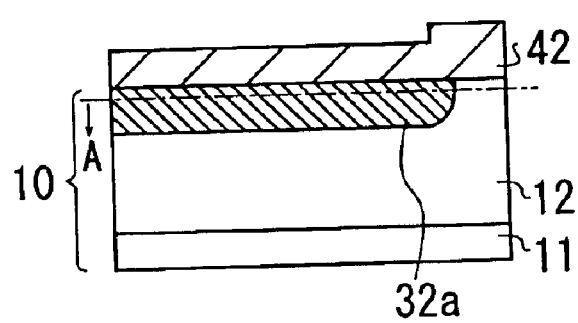
FIG. 5(a) is a third sectional view for illustrating the step of manufacturing the part corresponding to the section taken along the line X—X in FIG. 1.
Figure 5B:
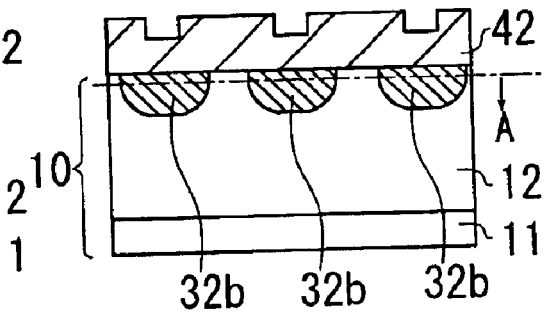
FIG. 5(b) is a third sectional view for illustrating the step of manufacturing the part corresponding to the section taken along the line Y—Y in FIG. 1.
Figure 27:
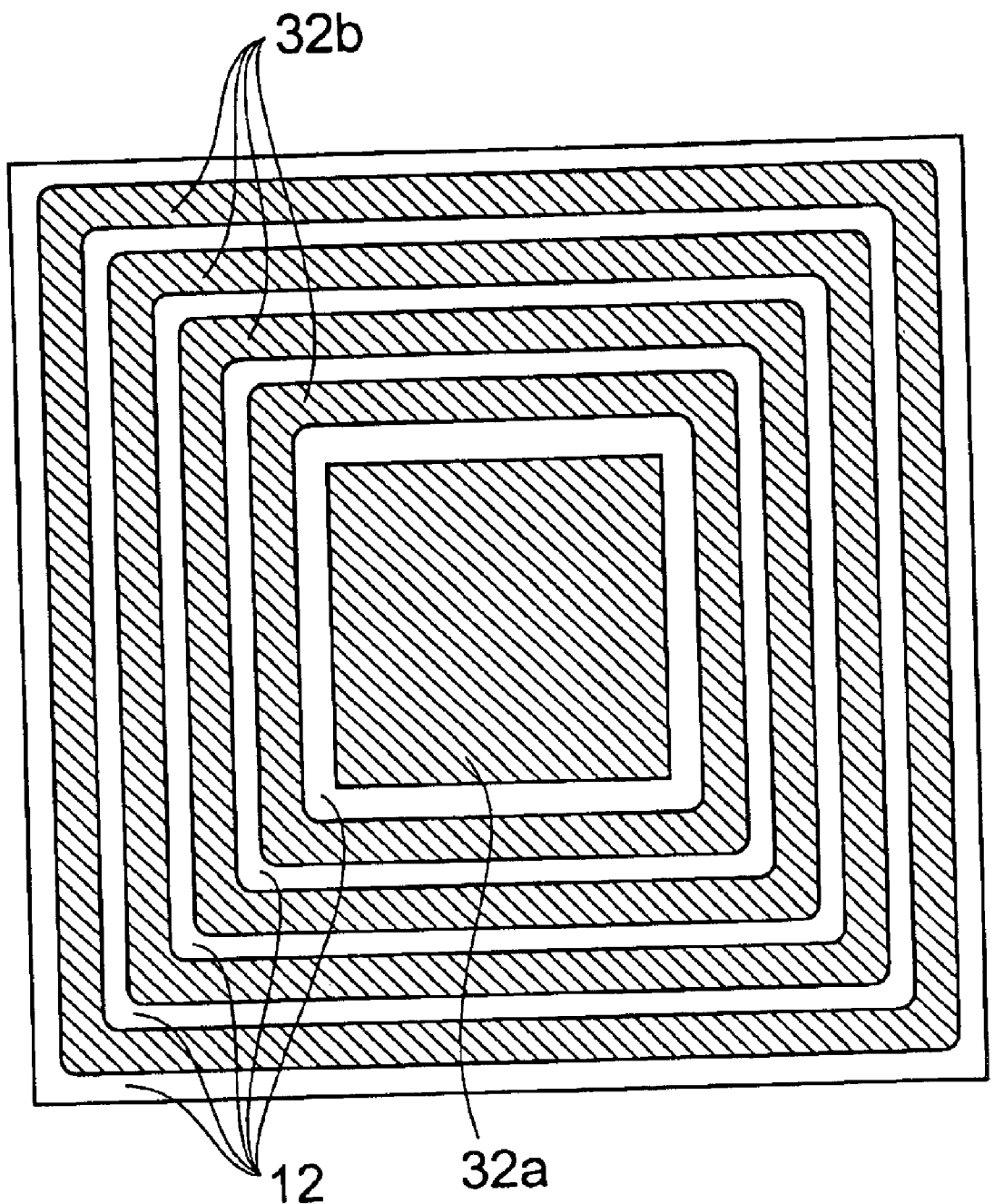
FIG. 27 is a sectional view taken along the line A—A in FIGS. 5(a) and 5(b)

FIG. 27 is a sectional view taken along the line A—A in FIGS. 5(a) and 5(b), showing the planar pattern for each diffusion region. The shape of the ring window openings 80b is reflected on the shape of the ring diffusion regions 32b and the outer and inner sides of the four corners are rounded.

When an impurity of the second conductivity type is diffused, an oxide film is formed at the bottom of the rectangular window opening 80a and the bottom of the ring window openings 80b. The oxide film is integrated with the oxide film 41 used as a mask during the impurity implantation. The reference numeral 42 represents the integrated oxide film as shown in FIGS. 5(a) and 5(b).

The oxide film 42 is then patterned, and as shown in FIGS. 6(a) and 6(b), a plurality of active groove window openings 81a are formed in a location on the rectangular diffusion region 32a and guard groove window openings 81b are formed in a location on the ring diffusion regions 32b. The active groove window openings 81a are linearly shaped, and the guard groove window openings 81b are ring-shaped. The guard groove window openings 81b is rectangular ring-shaped with no rounded part at the four corners.

When a resist film is patterned for forming the active groove window openings 81a, the guard groove window openings 81b, and the rectangular window opening 80a and the ring window openings 80b in FIGS. 3(a) and 3(b), the windowed part of the resist film is aligned with respect to the plane orientation of the growth layer 12, and the directions in which the four sides of the ring diffusion regions 32b extend and the directions in which the sides of the active grooves 22a and the guard grooves 22b along the {100} direction of the growth layer 12.

The active groove window openings 81a are formed to have a length to transverse the rectangular diffusion region 32a, and provided at regular intervals and in parallel to each other. The guard groove window openings 81b have a width smaller than that of the ring diffusion regions 32b, and are positioned in the center of the width of the ring diffusion regions 32b. All the active groove window openings 81a and the guard groove window openings 81b have the same width.

At the bottom face of the active groove window openings 81a and the guard groove window openings 81b thus formed, the surface of the rectangular diffusion region 32a and the surface of the ring diffusion regions 32b are exposed. Using the oxide film 42 as a mask, the silicon single crystal is etched more deeply than the rectangular diffusion region 32a and the ring diffusion regions 32b and yet not as deeply as to reach the substrate 11. Consequently, as shown in FIGS. 7(a) and 7(b), the narrow active grooves 22a and the rectangular ring-shaped guard grooves 22b are formed.

The planar shape of the guard groove 22b is a rectangular or square ring shape, between the inner side faces of the guard grooves 22b, between the outer side faces of the guard grooves 22b, and inner side face and outer side face of the guard grooves 22b are parallel or perpendicular to each other.

The bottom faces of the active grooves 22a and the guard grooves 22b are parallel to the surface of the growth layer 12, and the side face of the active groove 22a and the side face of the guard groove 22b are in the {100} plane-oriented, so that the surfaces of the silicon single crystal exposed in the guard grooves 22b and the active grooves 22a are all {100} plane orientation.

Figure 28:
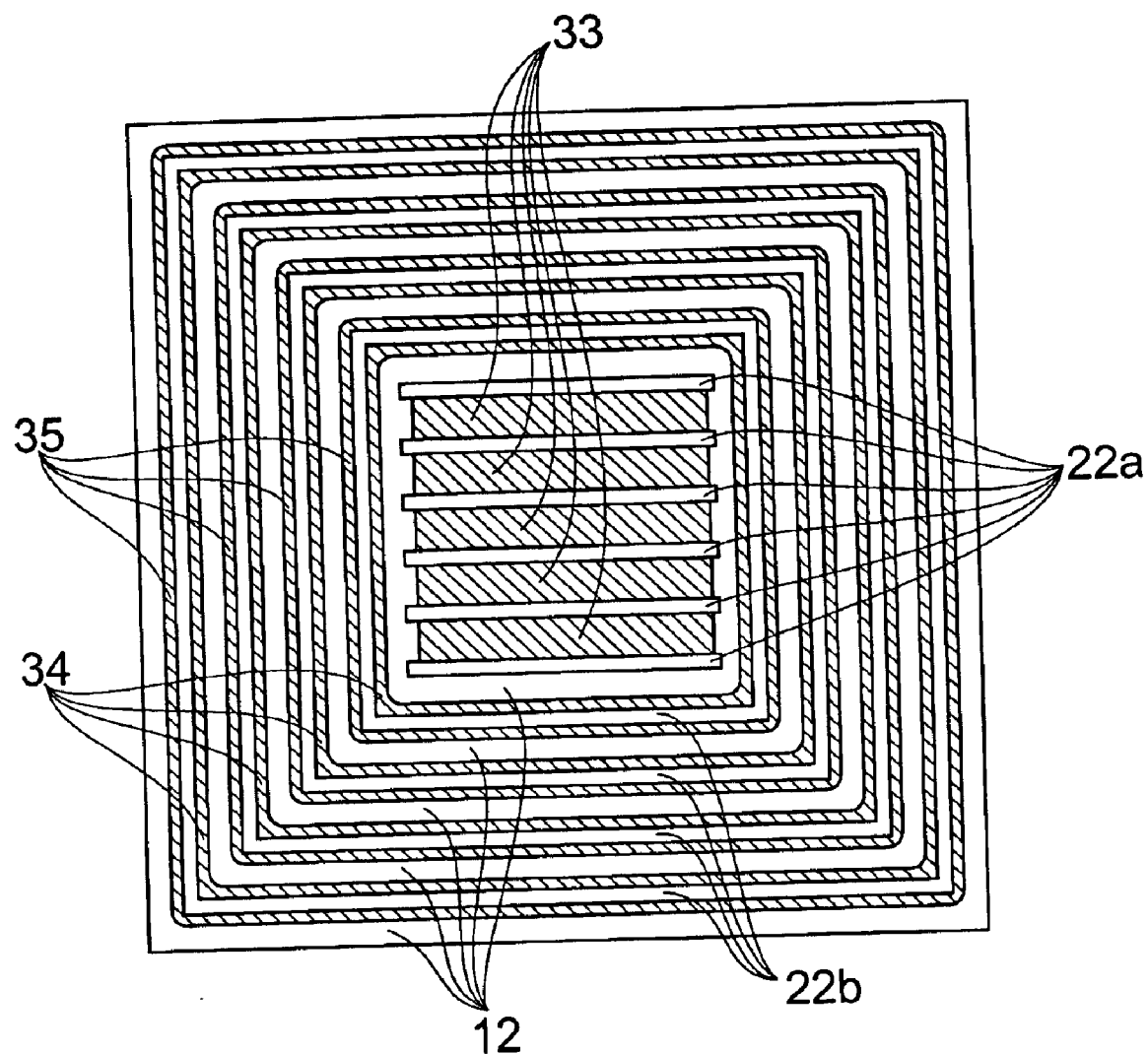
FIG. 28 is a sectional view taken along the line B—B in FIGS. 7(a) and 7(b)

FIG. 28 is a sectional view taken along the line B—B in FIGS. 7(a) and 7(b), showing the positional relation between the grooves 22a and 22b and the diffusion regions 33, 34, and 35 and the planar shape of the grooves 22a and 22b.

The active grooves 22a and the guard grooves 22b have the same depth and their bottoms are positioned between the bottom face of the rectangular diffusion region 32a and the top of the substrate 11. Therefore, the active grooves 22a are deeper than the rectangular diffusion region 32a, and therefore the rectangular diffusion region 32a is separated into a plurality of parts by the active grooves 22a. In this way, rectangular base regions 33 are formed.

The ring diffusion regions 32b are divided into two, i.e., the inner circumferential auxiliary diffusion regions 34 in contact with the inner circumference of the guard grooves 22b and the outer circumferential auxiliary diffusion regions 35 in contact with the outer circumference of the guard grooves 22b.

Then, a semiconductor single crystal of the second conductivity type is epitaxially grown at the bottom and side of the grooves 22a and 22b, thereby filling the grooves 22a and 22b with the semiconductor single crystal. Here, the semiconductor single crystal is a silicon single crystal.

The reference character 23a in FIG. 8(a) represents the filling region of the semiconductor single crystal grown in the active groove 22a. The reference character 23b in FIG. 8(b) represents a guard region made of the semiconductor single crystal grown in the guard groove 22b.

Figure 29:
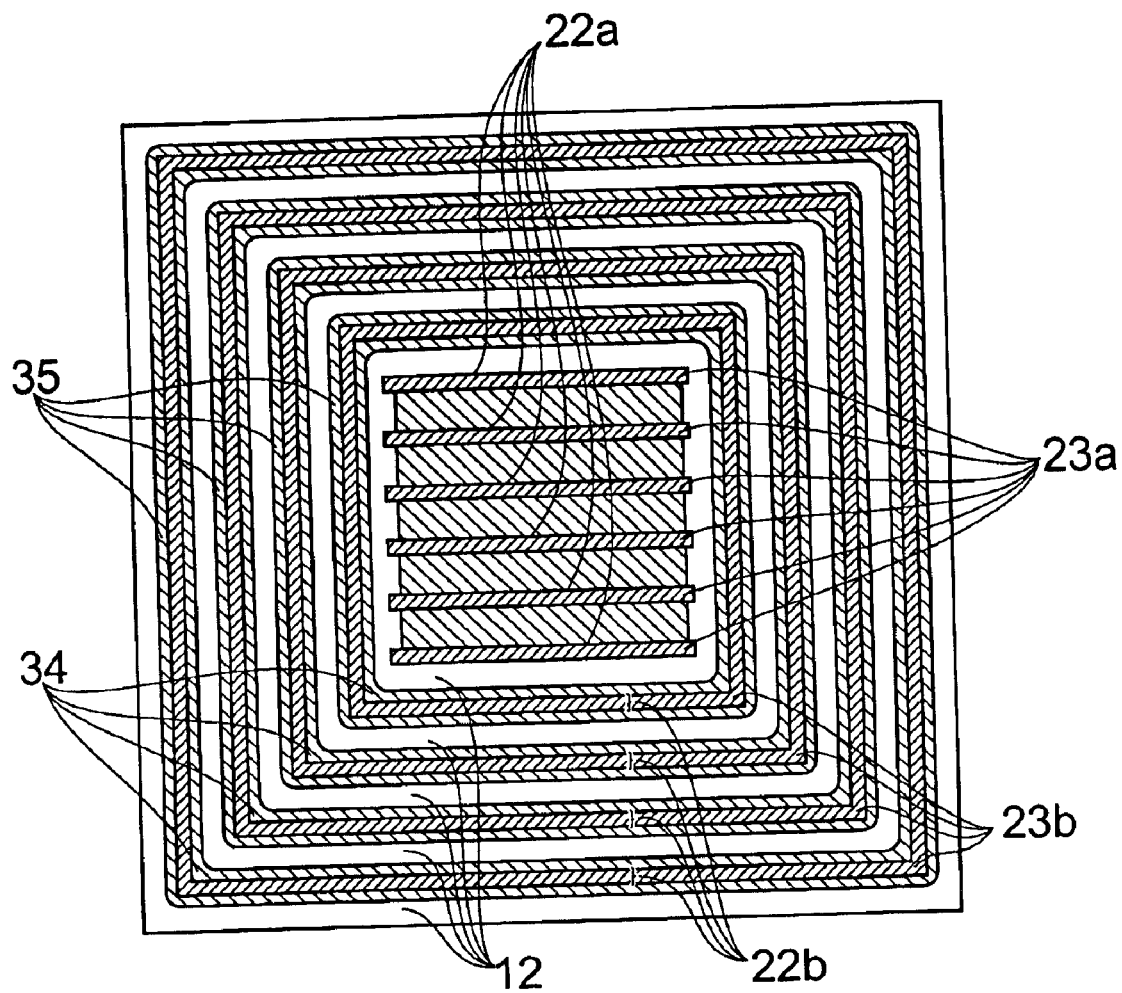
FIG. 29 is a sectional view taken along the line C—C in FIGS. 8(a) and 8(b)

FIG. 29 is a sectional view taken along the line C—C in FIGS. 8(a) and 8(b), showing the planar pattern of the filling regions 23a and the guard regions 23b.

Figure 9A:
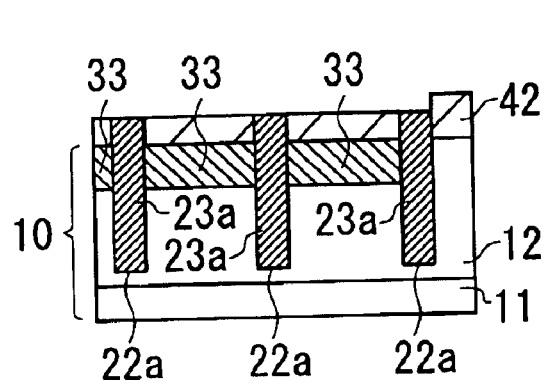
FIG. 9(a) is a seventh sectional view for illustrating the step of manufacturing the part corresponding to the section taken along the line X—X in FIG. 1.
Figure 9B:
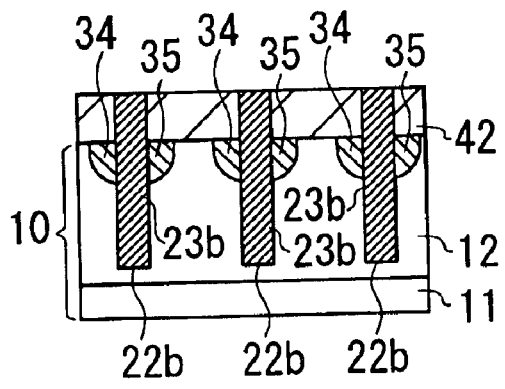
FIG. 9(b) is a seventh sectional view for illustrating the step of manufacturing the part corresponding to the section taken along the line Y—Y in FIG. 1.

Immediately after the growth of the semiconductor single crystal, the semiconductor single crystal forming the filling regions 23a and the semiconductor single crystal forming the guard regions 23b are raised above the surface level of the oxide film 42. Therefore, the raised part is etched away as shown in FIGS. 9(a) and 9(b), so that the filling regions 23a and the guard regions 23b are flush with the oxide film 42.

Figure 10A:
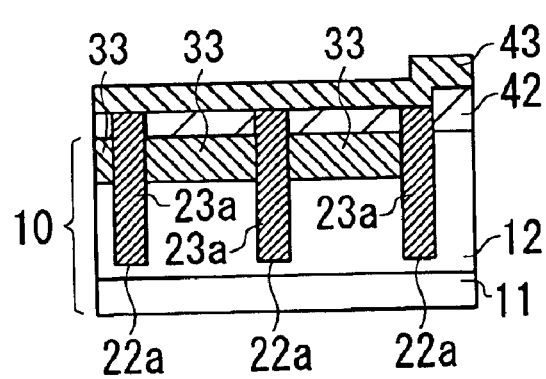
FIG. 10(a) is an eighth sectional view for illustrating the step of manufacturing the part corresponding to the section taken along the line X—X in FIG. 1.
Figure 10B:
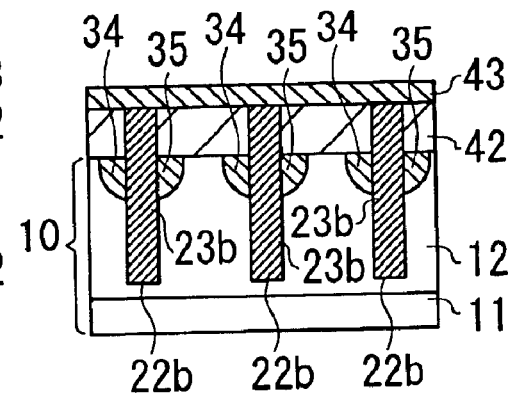
FIG. 10(b) is an eighth sectional view for illustrating the step of manufacturing the part corresponding to the section taken along the line Y—Y in FIG. 1.
Figure 11A:
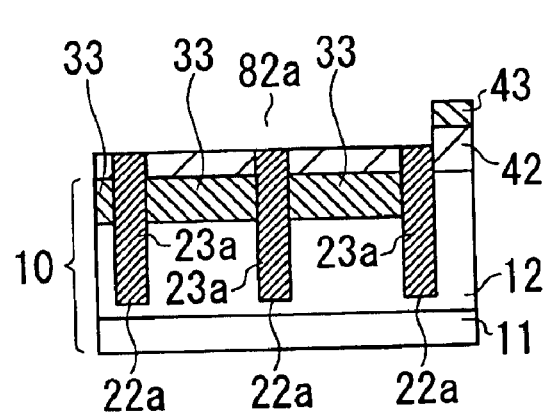
FIG. 11(a) is a ninth sectional view for illustrating the step of manufacturing the part corresponding to the section taken along the line X—X in FIG. 1.
Figure 11B:
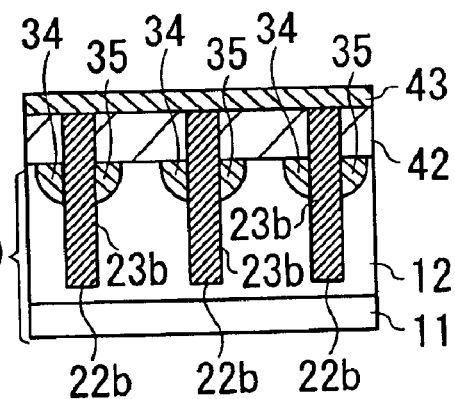
FIG. 11(b) is a ninth sectional view for illustrating the step of manufacturing the part corresponding to the section taken along the line Y—Y in FIG. 1.

As shown in FIGS. 10(a) and 10(b), an insulating film 43 of a silicon oxide film, for example, is formed on the surface of the oxide film 42, the filling regions 23a, and the guard regions 23b, and then the insulating film 43 is patterned, so that a window opening 82a is formed and the surfaces of the filling regions 23a are exposed at the bottom of the opening as shown in FIGS. 11(a) and 11(b). Meanwhile, the guard regions 23b have their surfaces covered with the insulating film 43.

Figures 12A, 12B:
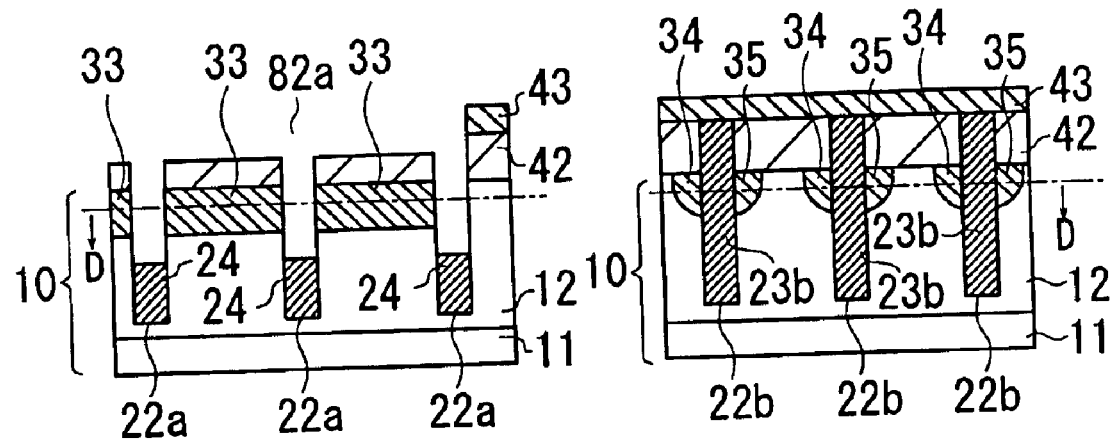
FIG. 12(a) is a 10th sectional view for illustrating the step of manufacturing the part corresponding to the section taken along the line X—X in FIG. 1.
FIG. 12(b) is a 10th sectional view for illustrating the step of manufacturing the part corresponding to the section taken along the line Y—Y in FIG. 1.

In this state, using the oxide film 42 at the bottom of the window opening 82a as a mask, the semiconductor single crystal is etched, so that the exposed filling regions 23a are etched. Here, the filling regions 23a are not entirely etched away. As shown in FIG. 12(a), only an upper part of the filling regions 23a is etched away, and the lower part of the filling regions 23a remains as buried regions 24.

The buried regions 24 are located at the bottom of the active grooves 22a. The top of the buried regions 24 is located in a deeper level than the bottom of the base regions 33. Therefore, above the level of the buried regions 24 in the active grooves 22a, the base regions 33 are exposed at the upper side faces of the active grooves 22a, and at the part below the level, the growth layer 12 is exposed. The buried regions 24 are in contact with the growth layer 12 to form a pn junction.

Here, when the filling region 23a has its upper part etched away along its entire length to form the buried region 24, the buried region 24 is located in a deeper level than the base region 33, and therefore the buried region 24 is isolated from the base region 33.

Meanwhile, although not shown, the upper part of the filling region 23a is partly covered with the insulating film 43, and the covered part is not etched and the filling region 23a is left in the part, and then, the other part is etched to form buried region 24. In this case, the unetched part is in contact with both the buried region 24 and the base region 33. Therefore the buried region 24 is connected to the base region 33 through the remaining filling region 23a. The surface of the filling region 23a may partly be covered with the insulating film 43 for a part along its length or width.

Note that according to the embodiment, the filling regions 23a are not left, and the buried regions 24 are isolated from the base regions 33.

Meanwhile, the guard regions 23b are covered with the insulating film 43, and therefore not etched at the time of forming the buried regions 24. The regions therefore do not change as shown in FIG. 12(b).

Figure 30:
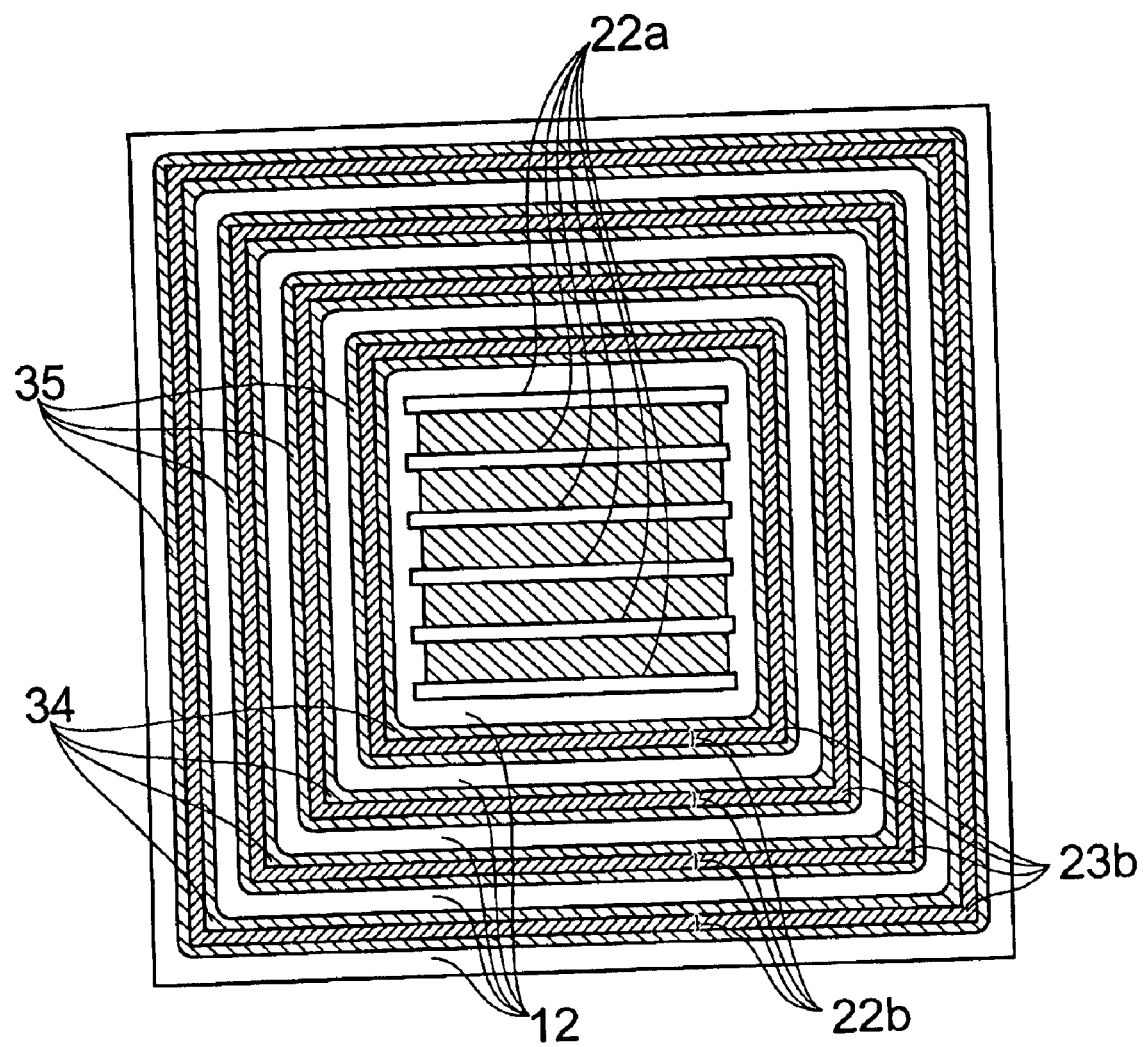
FIG. 30 is a sectional view taken along the line D—D in FIGS. 12(a) and 12(b)

FIG. 30 is a sectional view taken along the line D—D in FIGS. 12(a) and 12(b) and the plane view shows the difference between the states in the active grooves 22a and the guard grooves 22b.

After removing the insulating film 43 by etching, patterned resist layer is provided on the oxide film 42 in the state that the region where the active grooves 22a are positioned is exposed. The oxide film in this region is removed so that the surface of the base region 33 and a part of side face of active grooves 22a above the buried region 24 are entirely exposed as shown in FIG. 13(a). The oxide film 42 remains at the region where the guard grooves 22b are positioned as shown in FIG. 13(b).

In the state, thermal oxidation is carried out, and as shown in FIGS. 14(a) and 14(b), a gate insulating film 51 made of a silicon oxide film is formed on the exposed part of the inner circumferential side face of the active grooves 22a. The surfaces of the base regions 33 and the growth layer 12 exposed in the active grooves 22a are covered with the gate insulating film 51. At the time, the other part where the growth layer 12 is exposed such as the surface of the base region 33, the surfaces of the guard regions 23b and the buried regions 24 are also covered with the gate insulating film 51.

A space surrounded by the gate insulating film 51 is created in the part of the active grooves 22a above the buried region 24.

Then, as shown in FIGS. 15(a) and 15(b), a thin polysilicon film 53 is formed on the surface of the gate insulating film 51 by CVD. The part of the active grooves 22a above the buried regions 24 is filled with the thin polysilicon film 53.

Figure 16A:
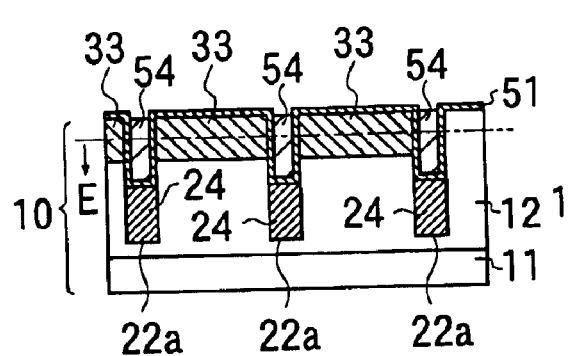
FIG. 16(a) is a 14th sectional view for illustrating the step of manufacturing the part corresponding to the section taken along the line X—X in FIG. 1.
Figure 16B:
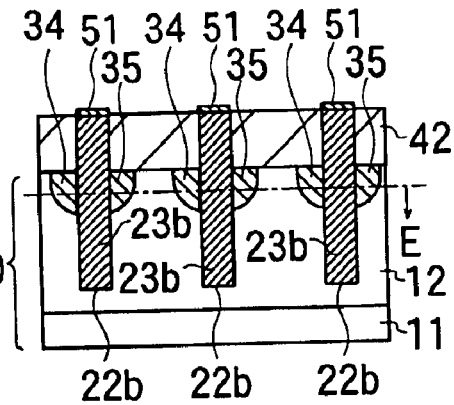
FIG. 16(b) is a 14th sectional view for illustrating the step of manufacturing the part corresponding to the section taken along the line Y—Y in FIG. 1.

Then, as shown in FIGS. 16(a) and 16(b), the thin polysilicon film 53 is etched away other than inside the active grooves 22a and partly outside the active grooves 22a. Then, the thin polysilicon film 53 remaining in the active grooves 22a forms gate electrodes 54.

At the time, a part of the polysilicon film positioned outside the active grooves 22a is left to form a connection portion, and the part is to be connected to a gate pad or a gate electrode which will be described.

Figure 31:
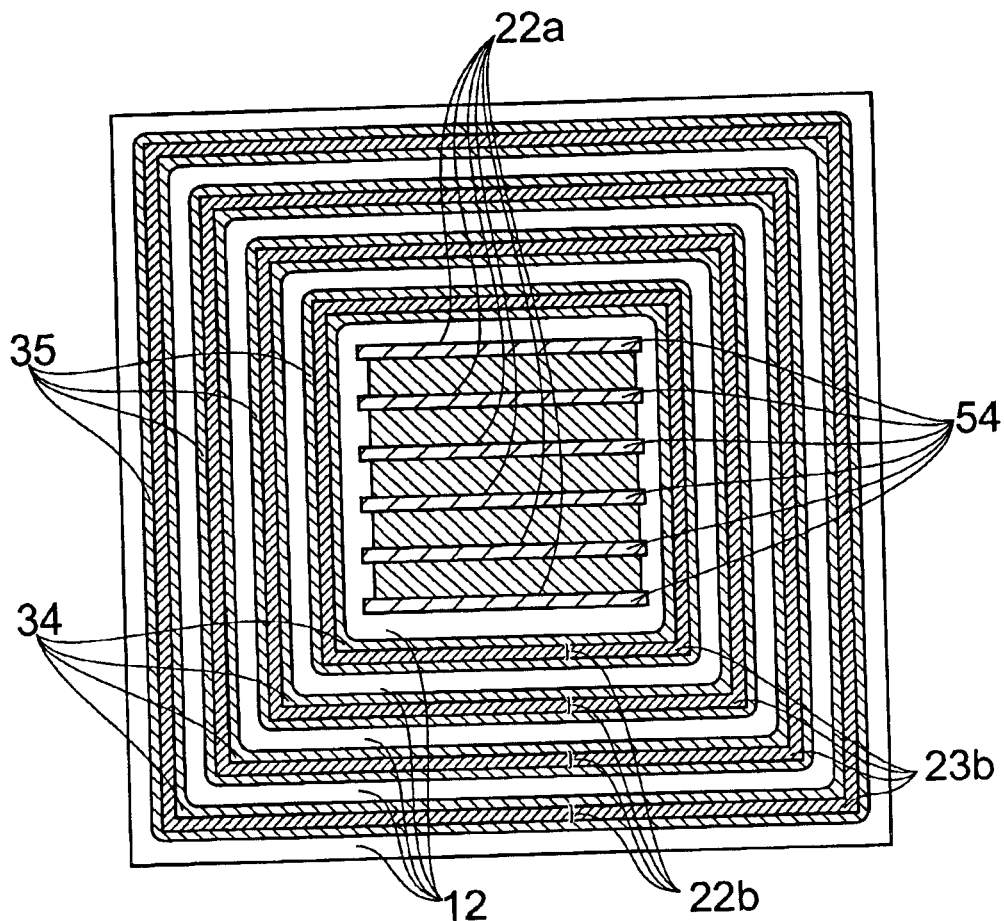
FIG. 31 is a sectional view taken along the line E—E in FIGS. 16(a) and 16(b)

FIG. 31 is a section taken along the line E—E in FIGS. 16(a) and 16(b), and the plane view shows the difference between the states in the active grooves 22a and the guard grooves 22b.

In this state, the gate insulating film 51 is positioned on the surface of the buried regions 24 in the active grooves 22a, and the part above the gate insulating film 51 is filled with the gate electrode 54. The buried regions 24 in the active grooves 22a and the gate electrodes 54 are insulated from each other by the gate insulating film 51.

The gate insulating film 51 is positioned between the gate electrodes 54 and the base regions 33, and between the gate electrodes 54 and the growth layer 12, so that the gate electrodes 54 is insulated from the base regions 33 and the growth layer 12. The surfaces of the base region 33 and the growth layer 12 are covered by the gate insulating film 51.

Figure 17A:
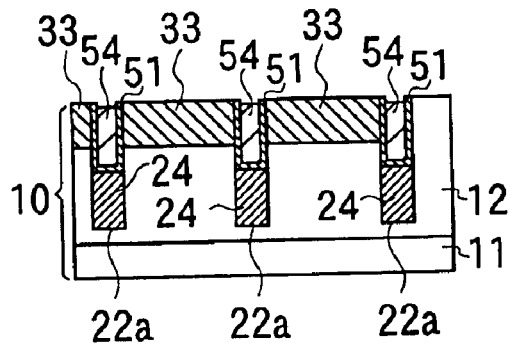
FIG. 17(a) is a 15th sectional view for illustrating the step of manufacturing the part corresponding to the section taken along the line X—X in FIG. 1.
Figure 17B:
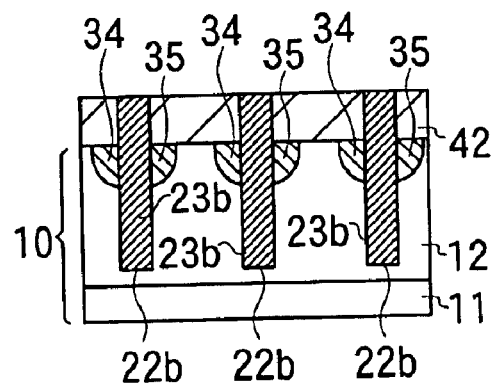
FIG. 17(b) is a 15th sectional view for illustrating the step of manufacturing the part corresponding to the section taken along the line Y—Y in FIG. 1.

As shown in FIGS. 17(a) and 17(b), the gate insulating film 51 is etched away except for the part positioned inside the active grooves 22a and covered with the gate electrode 54, and then the surfaces of the base regions 33 and the growth layer 12 are exposed.

Figure 18A:
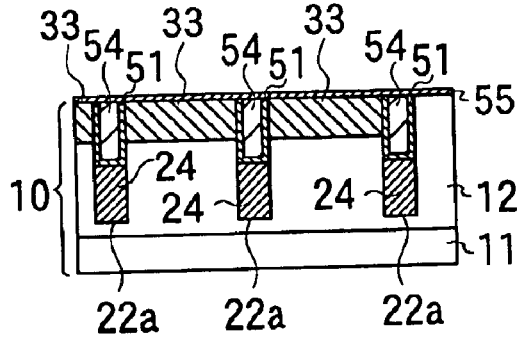
FIG. 18(a) is a 16th sectional view for illustrating the step of manufacturing the part corresponding to the section taken along the line X—X in FIG. 1.
Figure 18B:
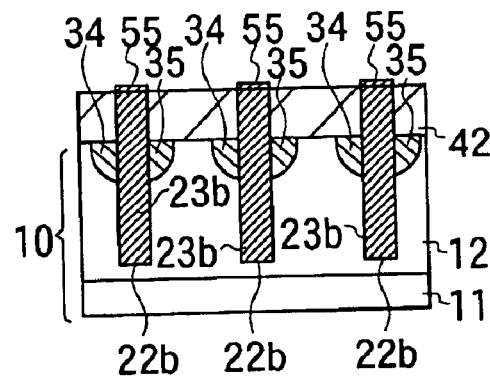
FIG. 18(b) is a 16th sectional view for illustrating the step of manufacturing the part corresponding to the section taken along the line Y—Y in FIG. 1.

In the state, thermal oxidation is carried out to form a thin oxide film. The reference numeral 55 in the FIGS. 18(a) and 18(b) represents the oxide film. The oxide film 55 is formed on the surfaces of the gate electrode 54 and the guard regions 23b in addition to the surfaces of the base region 33 and the growth layer 12.

Then, a patterned resist film is formed on the surface of the oxide film 55, and using the resist film as a mask, an impurity of the second conductivity type same as that of the base regions 33 is implanted into the surface of the base regions 33.

Figure 19A:
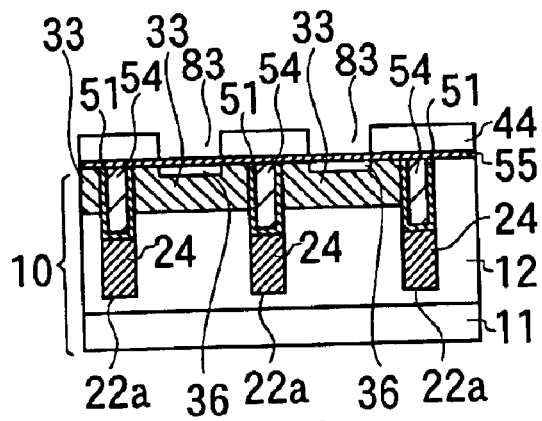
FIG. 19(a) is a 17th sectional view for illustrating the step of manufacturing the part corresponding to the section taken along the line X—X in FIG. 1.
Figure 19B:
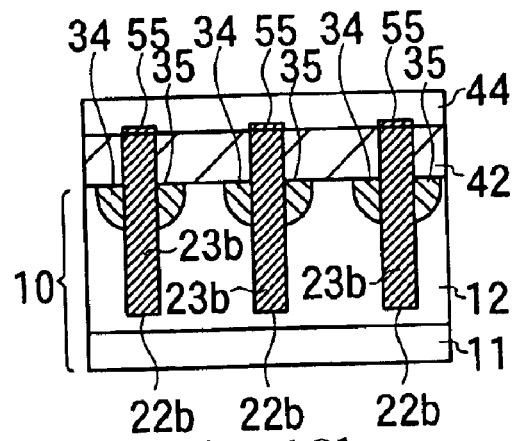
FIG. 19(b) is a 17th sectional view for illustrating the step of manufacturing the part corresponding to the section taken along the line Y—Y in FIG. 1.

The reference numeral 44 in FIGS. 19(a) and 19(b) represents the resist film, and there is a window opening 83 in the intermediate position between the active grooves 22a. The resist film 44 does not have a window opening in the region provided with the guard grooves 22b.

The implanted second conductivity type impurity penetrate through the oxide film 55 in the lower part of the window opening 83, and is implanted near the surface in the base region 33 immediately below the window opening 83. In this way, a high concentration region 36 of the second conductivity type is formed.

Figure 20A:
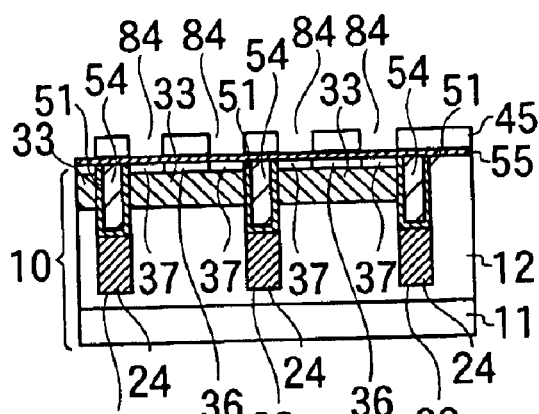
FIG. 20(a) is an 18th sectional view for illustrating the step of manufacturing the part corresponding to the section taken along the line X—X in FIG. 1.
Figure 20B:
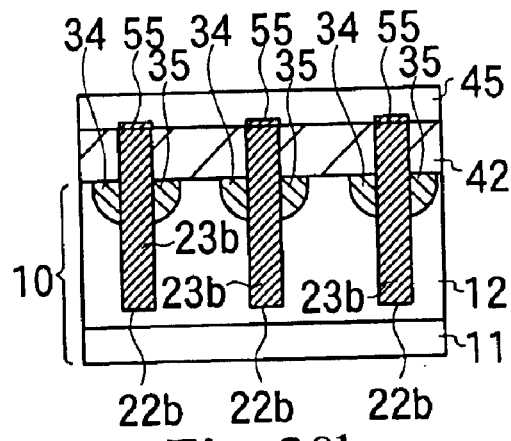
FIG. 20(b) is an 18th sectional view for illustrating the step of manufacturing the part corresponding to the section taken along the line Y—Y in FIG. 1.

The resist film 44 used as the mask is removed, and then as shown in FIGS. 20(a) and 20(b), a resist film 45 having another pattern is formed on the surface of the thin oxide film 55. The resist film 45 has a window opening 84 provided between the region where the high concentration region 36 having the second conductivity type is provided and the region where the gate electrode 54 and gate insulating film 51 are provided. There is no window opening in the region provided with the guard grooves 22b.

In this state, an impurity of the first conductivity type is implanted from above the resist film 45, and a high concentration region 37 of the first conductivity type is formed immediately below the window opening 84.

Figure 21A:
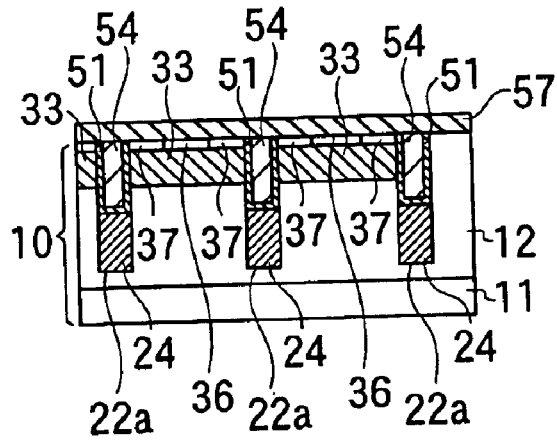
FIG. 21(a) is a 19th sectional view for illustrating the step of manufacturing the part corresponding to the section taken along the line X—X in FIG. 1.
Figure 21B:
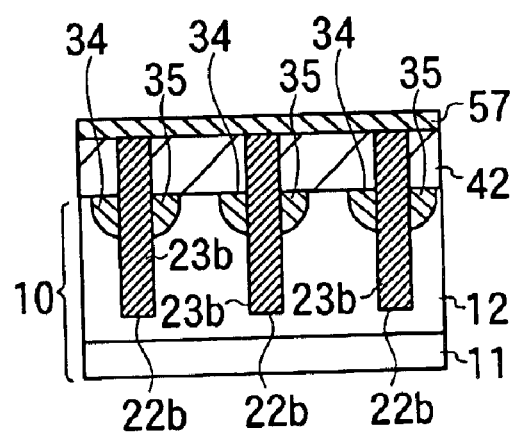
FIG. 21(b) is a 19th sectional view for illustrating the step of manufacturing the part corresponding to the section taken along the line Y—Y in FIG. 1.

Then, after removal of the resist film 45, an oxide film is deposited by CVD method on the thin oxide film 55, and thus an interlayer insulating film integrated with the thin oxide film 55 is formed. The reference numeral 57 in FIGS. 21(a) and 21(b) represents the interlayer insulating film integrated with the thin oxide film 55.

Figure 22A:
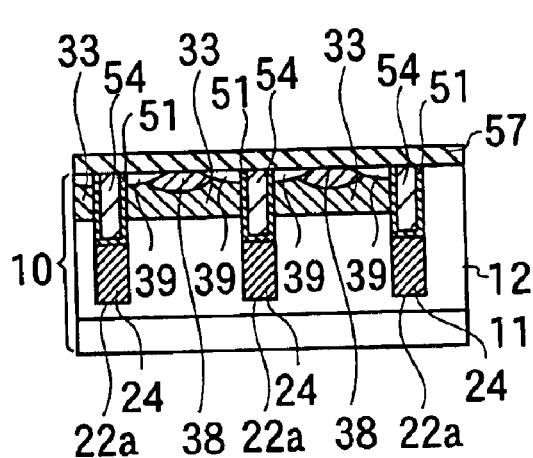
FIG. 22(a) is a 20th sectional view for illustrating the step of manufacturing the part corresponding to the section taken along the line X—X in FIG. 1.

In this state, thermal treatment is carried out, and the impurity of the first conductivity type and the impurity of the second conductivity type in the high concentration regions 36 and 37 are simultaneously diffused. Then, as shown in FIG. 22(a), an ohmic region 38 of the second conductivity type having a concentration higher than that of the base regions 33 is formed in the central position in the width of the base region 33. A source region 39 of the first conductivity type is formed on both sides of the ohmic region 38.

The transverse diffusion of the source region 39 terminates at the gate insulating film 51, and therefore the edge of the source region 39 on the side of the active groove 22a is in contact with the gate insulating film 51. The opposite side edge of the source region 39 is in contact with the ohmic region 38.

The ohmic region 38 and the source region 39 are shallower than the base region 33 and are positioned within the base region 33.

Figure 22B:
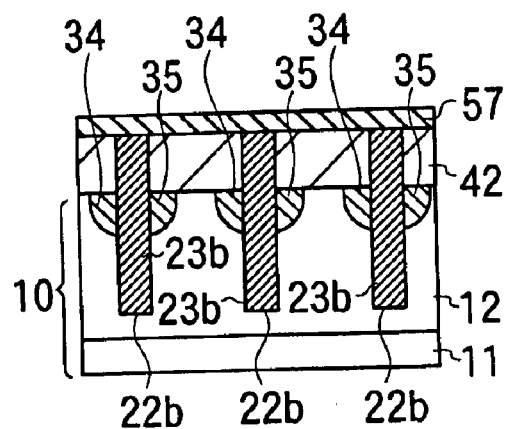
FIG. 22(b) is a 20th sectional view for illustrating the step of manufacturing the part corresponding to the section taken along the line Y—Y in FIG. 1.

When the ohmic region 38 and the source region 39 are formed, the region having the outer and inner circumferential auxiliary diffusion regions 35 and 34 is unchanged (FIG. 22(b)).

Figure 23A:
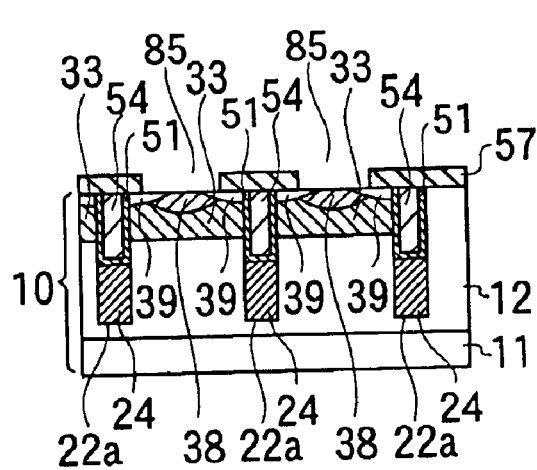
FIG. 23(a) is a 21st sectional view for illustrating the step of manufacturing the part corresponding to the section taken along the line X—X in FIG. 1.

Then, the interlayer insulating film 57 is patterned to form a window opening 85 in the position between the active grooves 22a as shown in FIG. 23(a), and a surface of the ohmic region 38 and a surface of the source regions 39 provided on both sides thereof are exposed.

Figure 23B:
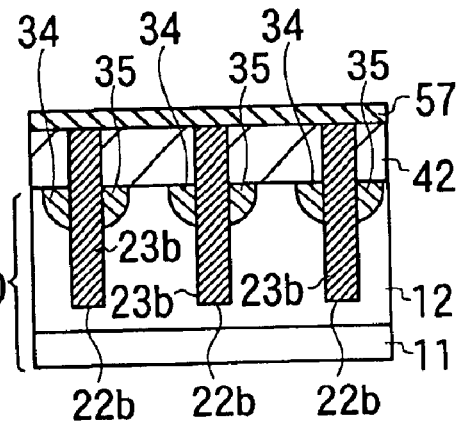
FIG. 23(b) is a 21st sectional view for illustrating the step of manufacturing the part corresponding to the section taken along the line Y—Y in FIG. 1.

At the time, the region having the outer and inner circumferential auxiliary diffusion regions 35 and 34 is not provided with a window opening 85 (FIG. 23(b)).

Figure 24A:
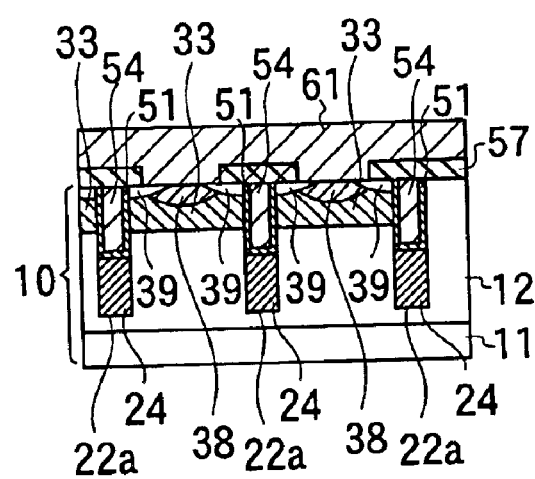
FIG. 24(a) is a 22nd sectional view for illustrating the step of manufacturing the part corresponding to the section taken along the line X—X in FIG. 1.

In the state, a thin metal film such as an aluminum film is formed and patterned to form a source electrode. The reference numeral 61 in FIG. 24(a) represents the source electrode which is in contact with the ohmic region 38 and the source region 39 in each of the base regions 33. Since the ohmic region 38 and the source region 39 have a high impurity concentration at their surfaces, an ohmic junction is formed between the source electrode 61, and the ohmic region 38 and the source region 39.

When the thin metal film is patterned, the other part than the part made into the source electrode 61 is left to be used as a gate pad made of the thin metal film. Through a connection portion made of the thin polysilicon film 53 or the thin metal film forming the gate pad, the gate electrodes 54 are allowed to be connected to the gate pad. Then, the gate pad is provided with voltage so that the same voltage can be applied to all the gate electrodes 54.

Figure 24B:
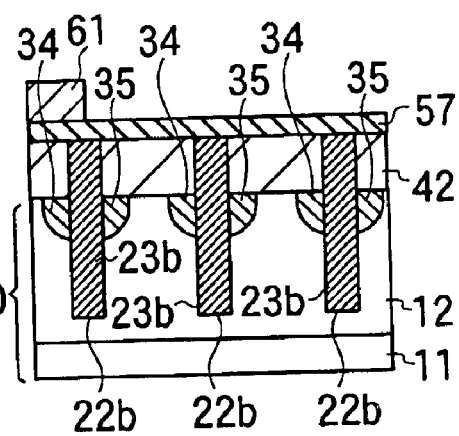
FIG. 24(b) is a 22nd sectional view for illustrating the step of manufacturing the part corresponding to the section taken along the line Y—Y in FIG. 1.

In the other part, as shown in FIG. 24(b), the thin metal film is removed.

Figure 25A:
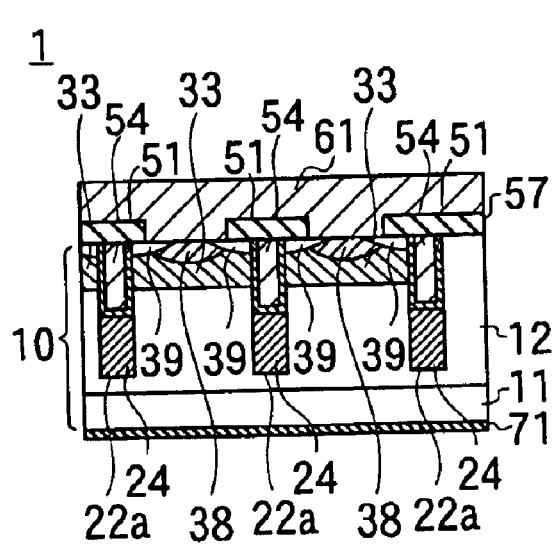
FIG. 25(a) is a 23rd sectional view for illustrating the step of manufacturing the part corresponding to the section taken along the line X—X in FIG. 1.
Figure 25B:
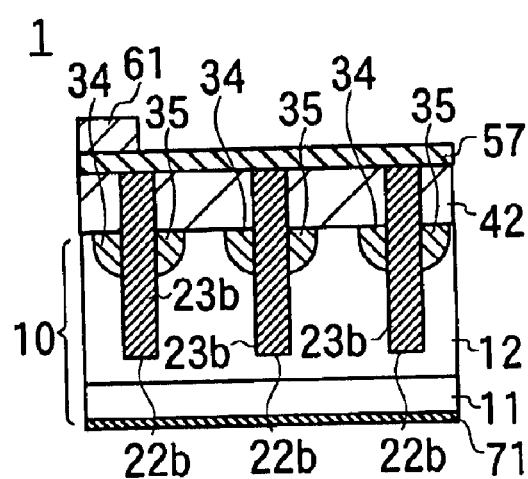
FIG. 25(b) is a 23rd sectional view for illustrating the step of manufacturing the part corresponding to the section taken along the line Y—Y in FIG. 1.

Then, a protection film that is not shown is formed on the surface of the source electrode 61. To use a part of the source electrode 61 as a source pad, the protection film is patterned to expose the source pad and the gate pad. Then, as shown in FIGS. 25(a) and 25(b), a drain electrode 71 made of a thin film of a metal such as a nickel alloy is formed on the back surface of the substrate 11. The substrate 11 has a high concentration and forms an ohmic junction with the drain electrode 71.

In this manner, the semiconductor device 1 according to the embodiment of the invention is provided.

A number of such semiconductor devices 1 are formed on a single substrate 10 to be processed, and in a dicing process after the step of forming the drain electrode 71, the substrate 10 is cut into the separate semiconductor devices 1. Then the drain electrode 71 is fixed onto a lead frame with metal solder or the like, and the gate pad and the source pad are connected to the lead frame by wire-bonding or the like. In this way, the semiconductor devices 1 are molded. Finally, the lead frame is cut and the leads connected to the drain electrode 71, the gate pad, and the source pad are separated, so that a semiconductor device 1 molded with resin is provided.

In the resin-molded semiconductor device 1, when the leads are electrically connected to an electrical circuit, the source electrode 61 is connected to a ground potential, positive voltage is applied to the drain electrode 71, and the voltage equal to or higher than the threshold voltage is applied to the gate electrode 54, the part of the base region 33 positioned between the source region 39 and the growth layer 12 and in contact with the gate insulating film 51 is inverted to have the first conductivity type. In this way, the inversion layer thus formed connects the source region 39 and the growth layer 12. Then, current is allowed to flow from the drain electrode 71 to the source electrode 61 through the substrate 11, the growth layer 12, the inversion layer, and the source region 39.

In the state, when, for example, the gate electrode 54 and the source electrode 61 are short-circuited so that the potential of the gate electrode 54 is brought to a level equal to or lower than the threshold voltage, the inversion layer disappears, and the current is cut off.

In this state, the pn junction between the base region 33 and the growth layer 12 is reverse-biased, and high voltage is applied to the drain electrode 71. The pn junction between the growth layer 12 and the base region 33 is reverse-biased, and a depletion layer expands into the base region 33 and the growth layer 12 from the pn junction.

When the buried region 24 is not connected to the base region 33, the buried region 24 is at a floating potential under only slight reverse-bias. When the depletion layer reaches to the buried region 24, the potential of the buried region 24 is stabilized so that the depletion layer expands from both the base region 33 and the buried region 24 into the growth layer 12, and the depletion layer also starts to expand into the buried region 24.

When the amount of the impurity of the second conductivity type in the buried region 24 and the amount of the impurity of the first conductivity type in the growth layer 12 positioned between the buried regions 24 are approximately equal to each other, the depletion layer expands widely, and the growth layer 12 positioned between the buried regions 24 is entirely depleted. It is known that at the time, the buried region 24 is entirely depleted inside, a part for a predetermined depth below the bottom of the base region 33 is entirely filled with the depletion layer, and the withstanding voltage increases accordingly.

Meanwhile, when the depletion layer expanded transversely from the buried region 24 and the base region 33 reaches the inner circumferential auxiliary diffusion region 34 or the guard region 23b, similarly to the buried region 24, the depletion layer starts to expand into the growth layer 12 from the guard region 23b or the inner and outer circumferential auxiliary diffusion regions 34 and 35 in contact with the guard region 23b.

Then, the voltage across the region between the drain electrode 71 and the source electrode 61 increases. When the depletion layer expanded from the guard region 23b on the inner side comes into contact with the inner circumferential auxiliary diffusion region 34 of the guard region 23b on the outer side, the depletion layer expands from the guard region 23b and the inner and outer circumferential auxiliary diffusion regions 34 and 35 in contact with the guard region 23b into the growth layer 12.

In this way, the depletion layer sequentially expands from the guard region 23b on the inner side and the inner and outer circumferential auxiliary diffusion regions 34 and 35 in contact with the guard region 23b into the guard region 23b on the outer side, so that the electric field intensity near the surface of the growth layer 12 is lowered.

Herein, the four sides of each of the guard regions 23b are connected approximately orthogonally, and the four corners of the guard region 23b are not rounded, but its outer four corners are connected with the rounded part of the outer circumferential auxiliary diffusion region 35. Consequently, at the four corners of the guard region 23b, the field intensity is considerably reduced as compared to the case without the outer circumferential auxiliary diffusion region 35.

The inner circumferential side of the guard region 23b is connected with the inner circumferential auxiliary diffusion region 34, and the rounded part of the inner circumferential auxiliary diffusion region 34 is provided to the four corners at the inner circumference of the guard region 23b. In this way, the electric field is relaxed at the part.

At the bottom and the side face of the active groove 22a and the guard groove 22b, the {100} plane of the semiconductor crystal of which the growth layer 12 and the base region 33 are formed is exposed, and the buried region 24 and the guard region 23b grow from planes in the same plane orientation. Consequently, the buried region 24 and the guard region 23b has no defects, and the withstanding voltage increases.

Note that in the above description, the first conductivity type is n type, while the second conductivity type is p type, but in the above and the embodiments that will follow, the first conductivity type may be p type, and the second conductivity type may be n type.

In the above embodiment, the present invention is applied to the MOSFET, but the semiconductor device according to the present invention may be applied to other devices such as an IGBT (Insulated Gate Bipolar Transistor) and a Schottky barrier diode.

Figure 32A:
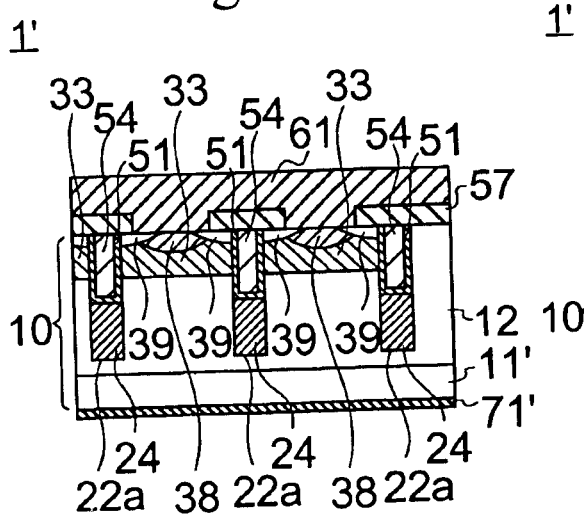
FIGS. 32(a) and 32(b) are sectional view for illustrating an IGBT as a semiconductor device according to the invention.
Figure 32B:
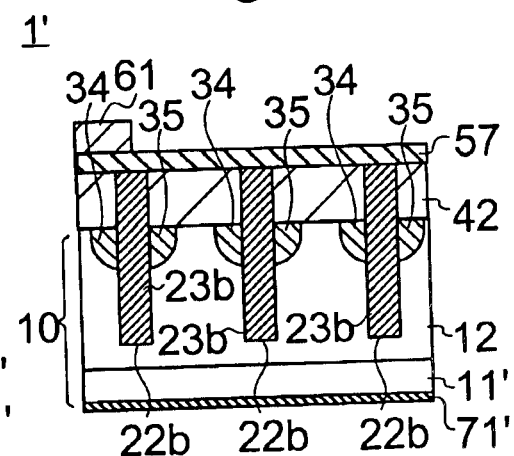

The reference numeral 1' in FIGS. 32(*a*) and 32(*b*) represents a semiconductor device which is an IGBT. The semiconductor device 1' has the same structure as the above embodiment except that the substrate 11' has the second conductivity type which is opposite to the conductivity type of the growth layer 12. A collector electrode 71' is formed at the surface of the substrate 11'.

The present invention is applicable not only to transistors but also to diodes. The reference numeral 2 in FIGS. 33 and 34 represents a Schottky barrier diode type semiconductor device.

Figure 33:
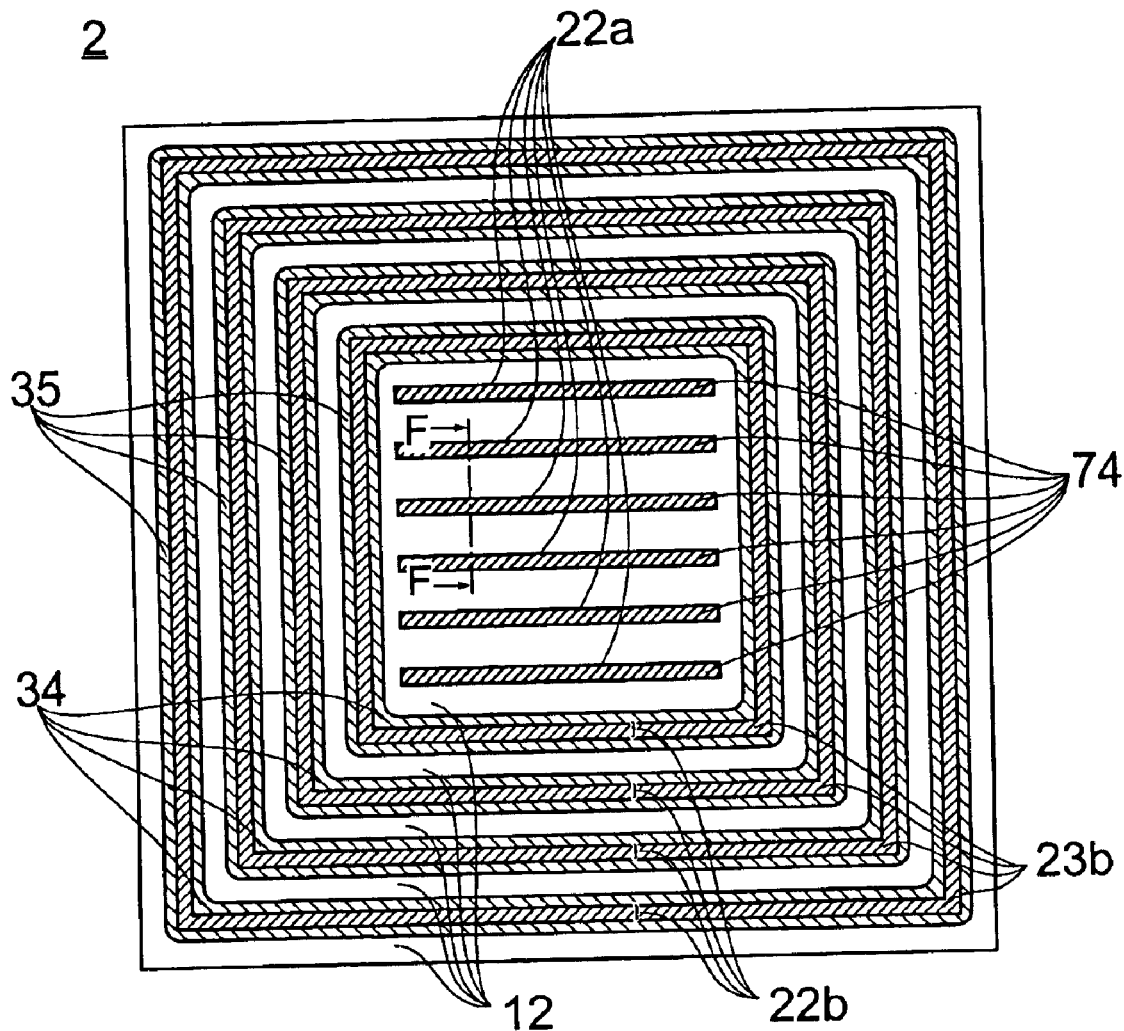
FIG. 33 is a plan view for illustrating a Schottky diode as a semiconductor device according to the present invention.
Figure 34:
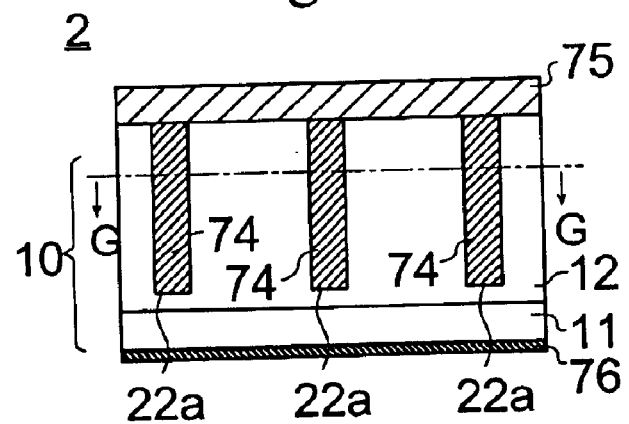
FIG. 34 is a sectional view taken along the line F—F in FIG. 33.

FIG. 33 is a plan view illustrating the diffusion structure. FIG. 33 is a section taken along the line G—G in FIG. 34, and FIG. 34 is a section of the part in the position of line F—F in FIG. 33.

In the semiconductor device 2, similarly to the semiconductor device 1 (MOSFET) according to the first embodiment, a number of ring-shaped guard grooves 22b are formed concentrically at the growth layer 12 of the first conductivity type and a second conductivity type semiconductor crystal is epitaxially grown in the guard grooves 22b, i.e., the guard regions 23b fill the grooves. The plane orientation of the side face and bottom surface of the guard grooves 22b is {100}. The guard regions 23b are not rounded at the four corners, but outer and inner circumferential auxiliary diffusion regions 35 and 34 are connected to the guard regions 23b on the outer and inner circumferential sides. Therefore, the rounded parts of the outer and inner circumferential auxiliary diffusion regions 35 and 34 are provided at the four corners of the outer and inner circumferences of the guard regions 23b.

In the growth layer 12, in the region inside the innermost circumferential auxiliary diffusion region 34, linear and narrow active grooves 22a are provided in a non-contact state with the guard grooves 22b. In the active groove 22a, a withstanding voltage region 74 of the same conductivity type and the same material as those of the guard region 23b is formed.

The upper end of the withstanding voltage region 74 is flush with the surface of the growth layer 12, and a Schottky electrode 75 is formed on the upper surface of the withstanding voltage region 74 and the surface of the growth layer 12.

The Schottky electrode 75 is made of thin film of metal which forms ohmic junction with the withstanding voltage region 74 and forms a Schottky junction with the growth layer 12. On the surface of the substrate 11, a back surface electrode 76 is formed.

The outer circumferential edge of the Schottky electrode 75 is positioned inside the innermost circumferential auxiliary diffusion region 34. The Schottky electrode 75 is not in contact with the inner and outer circumferential auxiliary diffusion regions 34 and 35 and the guard regions 23b.

The Schottky junction between the growth layer 12 and the Schottky electrode 75 has a direction to be forward-biased when the Schottky electrode 75 serves as an anode electrode and is provided with positive voltage and the back surface electrode 76 serves as a cathode electrode and is provided with negative voltage. The voltage in the direction to forward-bias the Schottky junction also forward-biases the pn junction formed between the withstanding voltage region 74 and the growth layer 12.

However, the voltage that causes the pn junction to be forward-biased and starts current flow is higher than the voltage that causes the Schottky junction to be forward-biased and starts current flow, and therefore current is allowed to pass only through the Schottky junction between the Schottky electrode 75 and the back surface electrode 76.

Conversely, when negative voltage is applied to the Schottky electrode 75 and positive voltage is applied to the back surface electrode 76, the Schottky junction and the pn junction are both reverse-biased and current is not allowed to pass therethrough.

In this state, a depletion layer expands into the growth layer 12 from the Schottky junction between the Schottky electrode 75 and the growth layer 12 and the pn junction between the withstanding voltage region 74 and the growth layer 12.

Upon reaching of the depletion layer to the guard region 23b and the inner circumferential auxiliary diffusion region 34, the depletion layer expands outwardly from the guard region 23b and the inner and outer circumferential auxiliary diffusion regions 34 and 35.

The guard region 23b and the inner and outer circumferential auxiliary diffusion regions 34 and 35 have the same structures as those of the MOSFET and IGBT, and therefore will not be detailed.

In the semiconductor device 2, the Schottky electrode 75 serves as an anode electrode, and the back surface electrode 76 serves as a cathode electrode. Meanwhile, in the semiconductor device according to the present invention, the Schottky electrode may serve as a cathode electrode, and the back surface electrode may serve as an anode electrode.

Figure 35:
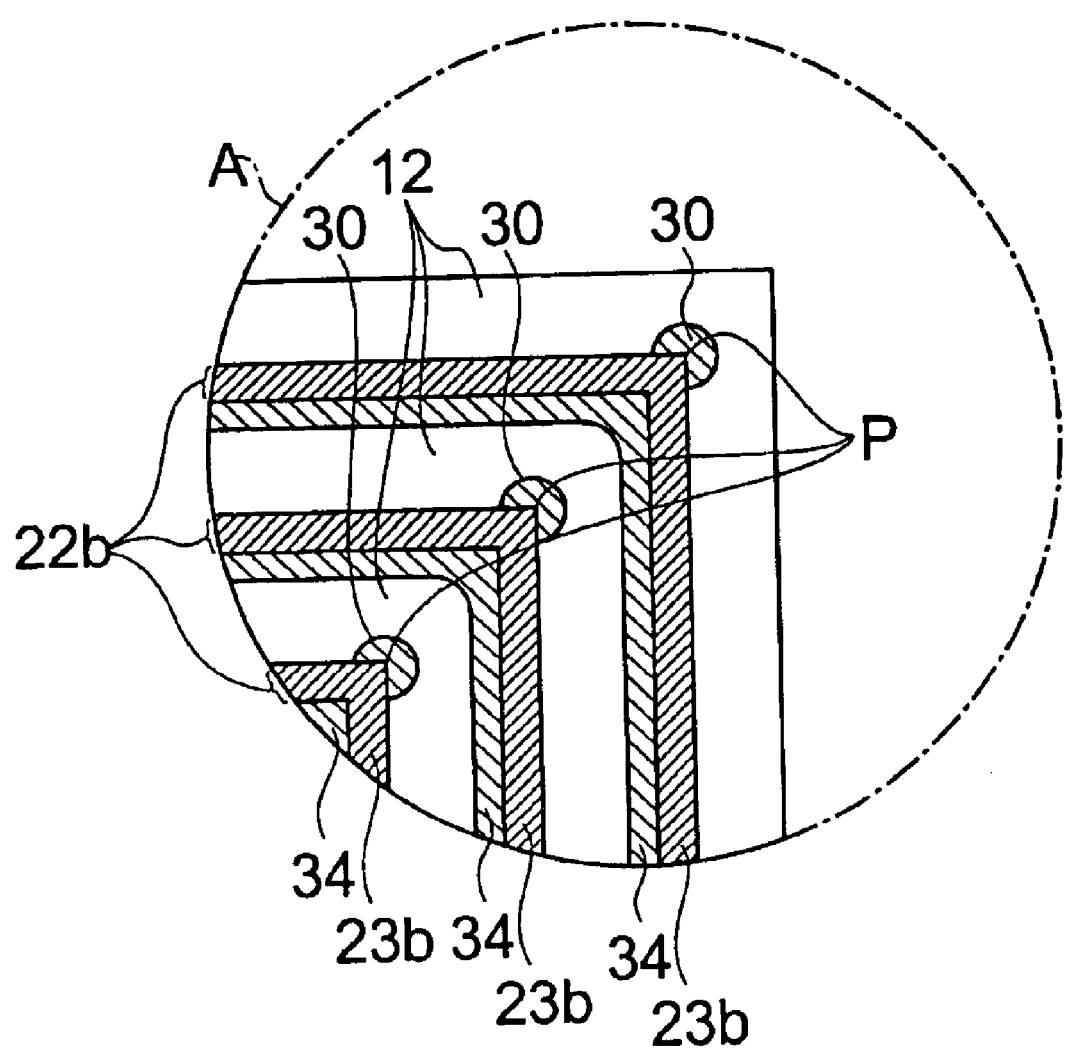
FIG. 35 is a view of another example of an outer circumferential auxiliary diffusion layer.
Figure 36A:
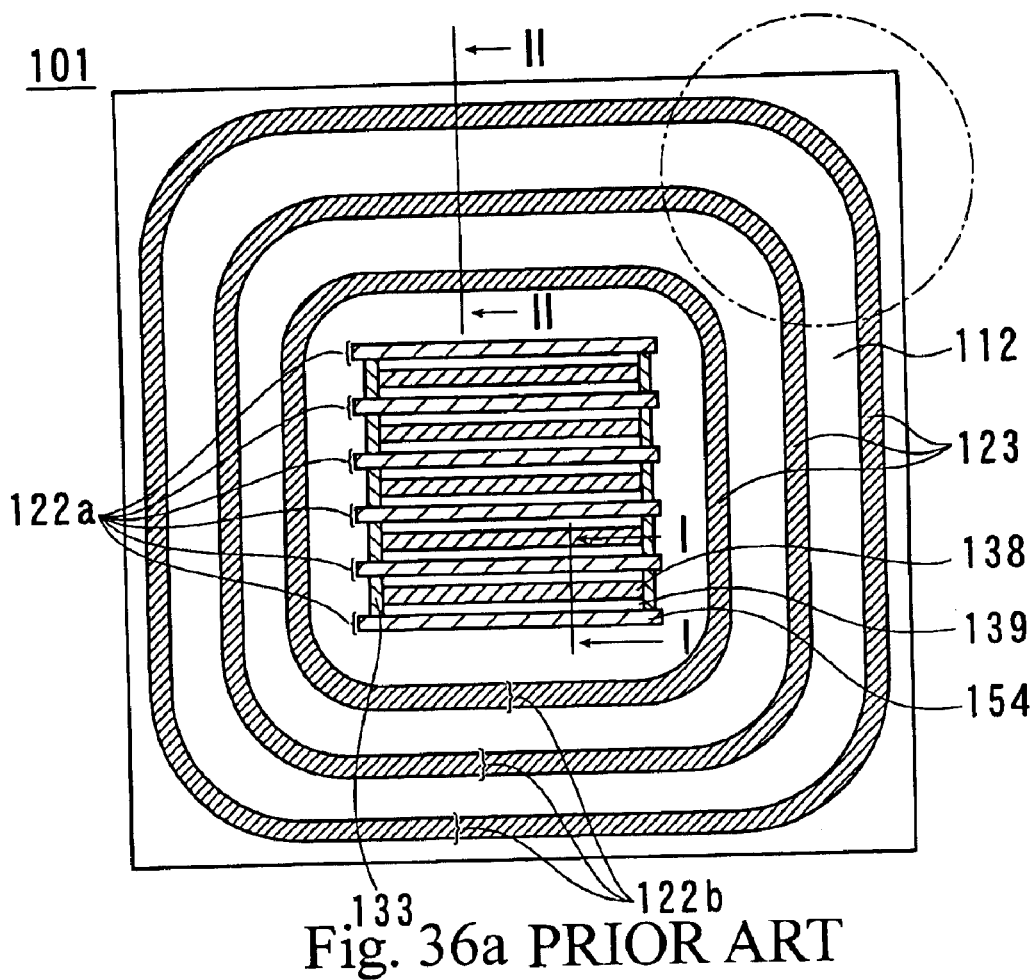
FIG. 36(a) is a plan view for illustrating the diffusion structure of a conventional MOSFET.
Figure 36B:
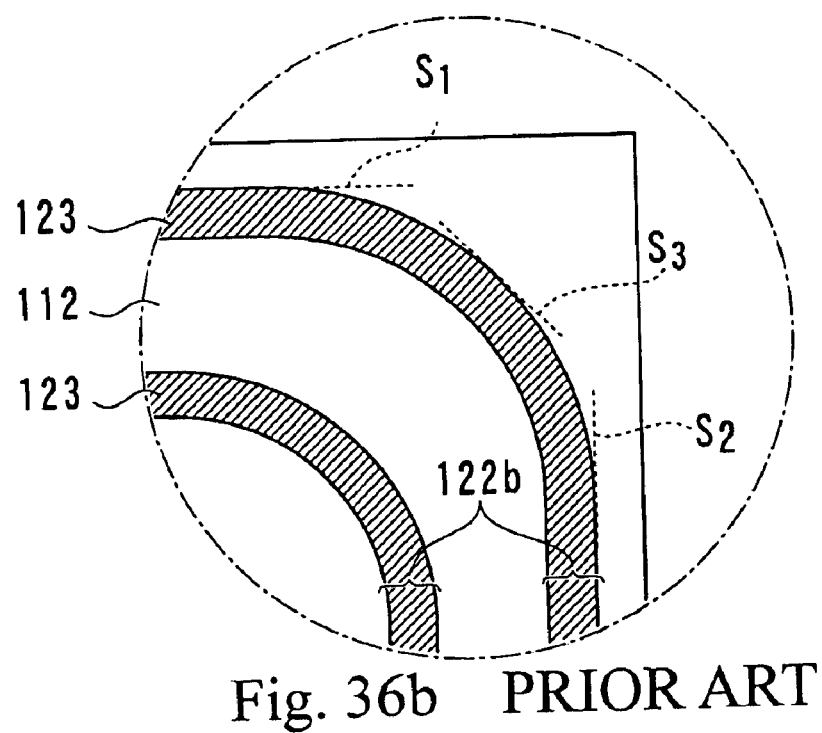
FIG. 36(b) is an enlarged view of the part surrounded by a chain-dotted line in the plan view.
Figure 37A:
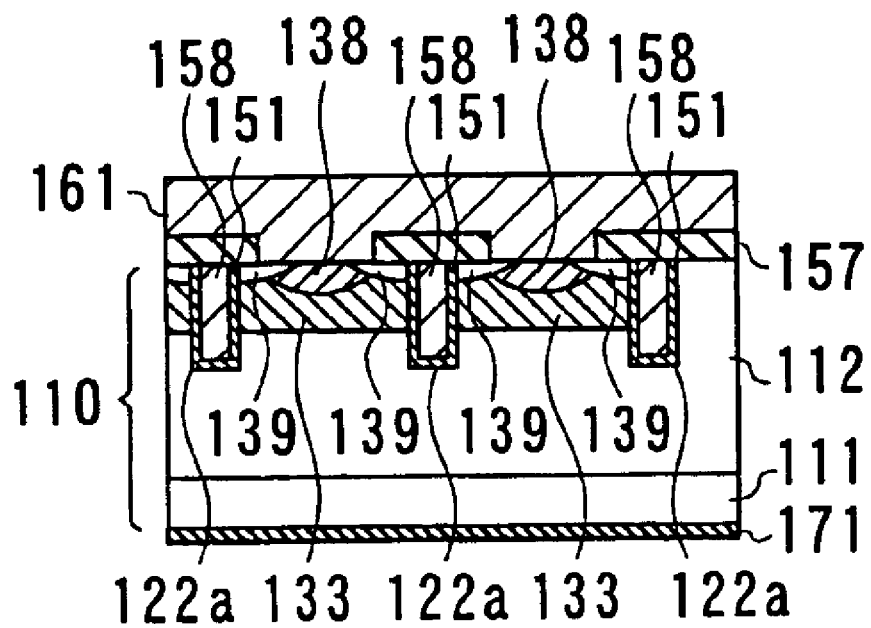
FIG. 37(a) is a sectional view taken along the line I—I in FIG. 36(a)
Figure 37B:
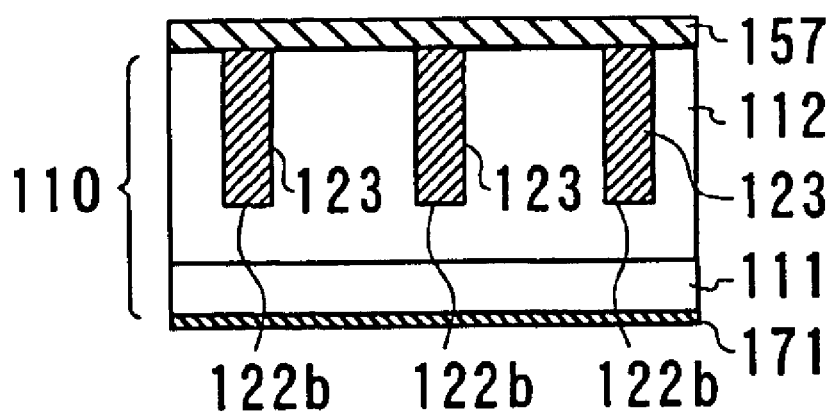
FIG. 37(b) is a sectional view taken along the line II—II in FIG. 36(a).

In the semiconductor devices 1, 1' and 2, the outer circumferential auxiliary diffusion region 35 is ring-shaped, but as shown in FIG. 35, independent outer circumferential auxiliary diffusion layers 30 may be provided at apexes P at the four corners of the guard regions 23b. The part of the guard regions 23b excluding the four corners at the surface of the four sides of the guard regions 23b may be in contact with the growth layer 12.

Note that in the above embodiments, the inner and outer circumferential sides of the four corners of the ring window opening 80b have a shape as quarter of circle. The four corners of the outer circumferential auxiliary diffusion region 35 and the four corners of the inner circumferential auxiliary diffusion region 34 are curved at a predetermined curvature, and the four corners of the guard regions 23b are added round regions at the inner and outer circumferences. Meanwhile, if the inner and outer circumferences of the four corners of the ring window opening 80b may be polygons with two or more angles but not quarter of circle, the second conductivity type impurity transversely diffuses, and therefore the four corners of the outer circumferential auxiliary diffusion region 35 and the four corner of the inner circumferential auxiliary diffusion region 34 are rounded.

Therefore, the present invention covers the case in which the parts of a mask used in the photolithography process corresponding to the four corners of the outer circumferential auxiliary diffusion region 35 and the four corner of the inner circumferential auxiliary diffusion region 34 are polygons.

According to the present invention, the semiconductor device having grooves uniformly filled with a semiconductor filler is provided.

What is claimed is:

1. A semiconductor device comprising:
   a growth layer of a first conductivity type;
   a rectangular ring-shaped guard groove surrounding a part having at least one region of a second conductivity type formed in said growth layer; and
   a guard region of the second conductivity type provided in said guard groove,
   an outer circumferential auxiliary diffusion region of the second conductivity type connected to four corners of outer circumferential portion of said guard region to add a round region.

2. The semiconductor device according to claim 1 wherein
   a plurality of said guard grooves are concentrically provided, each of said guard grooves being connected with said outer circumferential auxiliary diffusion region.

3. The semiconductor device according to claim 1,
   wherein a {100} plane is exposed at four side faces and bottom face of said guard groove, and said guard region is made of a semiconductor single crystal epitaxially grown from the side faces and the bottom faces of said guard groove.

4. The semiconductor device according to claim 1,
   wherein said outer circumferential auxiliary diffusion region is formed by diffusing an impurity of the second conductivity type from the surface of said growth layer.

5. The semiconductor device according claim 1,
   wherein said outer circumferential auxiliary diffusion region is formed shallower than the depth of said guard region.

6. The semiconductor device according claim 1,
   wherein a cell for a MOS transistor is formed in the part surrounded by said guard grooves, said MOS transistor having a base region of the second conductivity type, a source region of the first conductivity type formed in said base region, a gate insulating film in contact with said base region, and a gate electrode in contact with said gate insulating film.

7. The semiconductor device according to claim 1,
   wherein in the part surrounded by said guard grooves, a Schottky electrode to form a Schottky junction with said growth layer is provided.

8. A semiconductor device comprising:
   a growth layer of a first conductivity type;
   a rectangular ring-shaped guard groove surrounding a part having at least one region of a second conductivity type formed in said growth layer; and a guard region of the second conductivity type provided in said guard groove, a ring-shaped outer circumferential auxiliary diffusion region of the second conductivity type connecting to said guard region, wherein the outer circumferential auxiliary diffusion region surround said guard region, and having its four corners round shape at an outer circumferential portion thereof.

9. The semiconductor device according to claim 8, wherein a plurality of said guard grooves are concentrically provided, each of said guard grooves being connected with said outer circumferential auxiliary diffusion region.

10. The semiconductor device according to claim 8, wherein a {100} plane is exposed at four side faces and bottom face of said guard groove, and said guard region is made of a semiconductor single crystal epitaxially grown from the side faces and the bottom faces of said guard groove.

11. The semiconductor device according to claim 8, wherein said outer circumferential auxiliary diffusion region is formed by diffusing an impurity of the second conductivity type from the surface of said growth layer.

12. The semiconductor device according claim 8, wherein said outer circumferential auxiliary diffusion region is formed shallower than the depth of said guard region.

13. The semiconductor device according claim 8, wherein a cell for a MOS transistor is formed in the part surrounded by said guard grooves, said MOS transistor having a base region of the second conductivity type, a source region of the first conductivity type formed in said base region, a gate insulating film in contact with said base region, and a gate electrode in contact with said gate insulating film.

14. The semiconductor device according to claim 8, wherein in the part surrounded by said guard grooves, a Schottky electrode to form a Schottky junction with said growth layer is provided.

15. A semiconductor device, comprising:

a growth layer of a first conductivity type;

a rectangular ring-shaped guard groove concentrically surrounding a part having at least one region of a second conductivity type formed in said growth layer;

a guard region of the second conductivity type provided in said guard groove;

a ring-shaped outer circumferential auxiliary diffusion region of the second conductivity type in contact with an outer circumference of said guard region and having its four corners at an outer circumferential portion thereof rounded; and a ring-shaped inner circumferential auxiliary diffusion region of the second conductivity type in contact with an inner circumference of said guard region.

16. The semiconductor device according to claim 15, wherein said inner circumferential auxiliary diffusion region has its four corners rounded at an inner circumferential portion thereof.

17. The semiconductor device according to claim 16, wherein a plurality of said guard grooves are concentrically provided, and each of said guard grooves is connected with said outer circumferential auxiliary diffusion regions and said inner circumferential auxiliary diffusion regions.

18. The semiconductor device according to claim 15, wherein a {100} plane is exposed at four side faces and bottom face of said guard groove, and said guard region is made of a semiconductor single crystal epitaxially grown from the side faces and the bottom faces of said guard groove.

19. The semiconductor device according to claim 15, wherein said outer circumferential auxiliary diffusion region is formed by diffusing an impurity of the second conductivity type from the surface of said growth layer.

20. The semiconductor device according claim 15, wherein said outer circumferential auxiliary diffusion region is formed shallower than the depth of said guard region.

21. The semiconductor device according claim 15, wherein a cell for a MOS transistor is formed in the part surrounded by said guard grooves, said MOS transistor having a base region of the second conductivity type, a source region of the first conductivity type formed in said base region, a gate insulating film in contact with said base region, and a gate electrode in contact with said gate insulating film.

22. The semiconductor device according to claim 15, wherein in the part surrounded by said guard grooves, a Schottky electrode to form a Schottky junction with said growth layer is provided.

* * * * *